(12) United States Patent
Komatsu et al.

(10) Patent No.: US 11,270,883 B2
(45) Date of Patent: Mar. 8, 2022

(54) PATTERN-FORMING METHOD AND COMPOSITION

(71) Applicant: JSR CORPORATION, Tokyo (JP)

(72) Inventors: Hiroyuki Komatsu, Tokyo (JP); Motohiro Shiratani, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 17/018,169

(22) Filed: Sep. 11, 2020

(65) Prior Publication Data

US 2021/0082689 A1 Mar. 18, 2021

(30) Foreign Application Priority Data

Sep. 12, 2019 (JP) .............................. JP2019-166674

(51) Int. Cl.
| | | |
|---|---|---|
| *H01L 21/311* | (2006.01) | |
| *H01L 21/027* | (2006.01) | |
| *H01L 21/02* | (2006.01) | |
| *H01L 21/321* | (2006.01) | |
| *C08F 8/00* | (2006.01) | |

(52) U.S. Cl.
CPC ............ *H01L 21/0271* (2013.01); *C08F 8/00* (2013.01); *H01L 21/02118* (2013.01); *H01L 21/02334* (2013.01); *H01L 21/321* (2013.01)

(58) Field of Classification Search
CPC ................................................ H01L 21/31138
See application file for complete search history.

(56) References Cited

U.S. PATENT DOCUMENTS

| | | | |
|---|---|---|---|
| 2014/0335324 A1* | 11/2014 | Kim ...................... | G03F 7/0002 |
| | | | 428/195.1 |
| 2015/0004544 A1* | 1/2015 | Namai .................... | G03F 7/038 |
| | | | 430/285.1 |
| 2019/0198316 A1 | 6/2019 | Komatsu et al. | |

FOREIGN PATENT DOCUMENTS

WO      WO-2018043304 A1      3/2018

* cited by examiner

*Primary Examiner* — Thomas T Pham
(74) *Attorney, Agent, or Firm* — Element IP, PLC

(57) ABSTRACT

A pattern-forming method includes applying a first composition on a surface layer of a substrate to form a first coating film. The surface layer includes a first region which includes a metal atom, and a second region which includes a silicon atom. The first coating film is heated. A portion other than a portion formed on the first region or a portion other than a portion formed on the second region of the first coating film heated is removed, thereby forming a first lamination portion. A second composition is applied on the substrate on which the first lamination portion is formed to form a second coating film. The second coating film is heated or exposed. A portion other than a portion formed on the first lamination portion of the second coating film heated or exposed is removed, thereby forming a second lamination portion.

17 Claims, 2 Drawing Sheets

PATTERN-FORMING METHOD AND COMPOSITION

CROSS-REFERENCE TO RELATED APPLICATIONS

The present application claims priority to Japanese Patent Application No. 2019-166674, filed Sep. 12, 2019, the contents of which are incorporated herein by reference in their entirety.

BACKGROUND OF THE INVENTION

Field of the Invention

The present invention relates to a pattern-forming method and a composition.

Discussion of the Background

Further miniaturization of semiconductor devices has been accompanied by a demand for a technique of forming a fine pattern with a size of no greater than 30 nm. However, optical factors and the like have led to technical difficulties for conventional methods employing lithography.

Therefore, a bottom-up technique, as generally referred to, has been investigated for forming a fine pattern. As the bottom-up technique, for example, a method including: chemically modifying in a selective manner, a base provided with a surface layer having fine regions; forming a metal oxide on regions of the base not chemically modified by an ALD (Atomic Layer Deposition) process, a CVD (Chemical Vapor Deposition) process or the like; and thereafter removing the chemical modification to form a pattern on the base has been studied. According to such methods, high regional selectivity of the chemical modification to be applied to the base is desired, and thus various materials have been under investigation (see PCT International Publication No. 2018/043304).

SUMMARY OF THE INVENTION

According to an aspect of the present invention, a pattern-forming method includes applying a first composition on a surface layer of a substrate to form a first coating film. The surface layer includes a first region which includes a metal atom, and a second region which includes a silicon atom. The first coating film is heated. A portion other than a portion formed on the first region or a portion other than a portion formed on the second region of the first coating film heated is removed, thereby forming a first lamination portion. A second composition is applied on the substrate on which the first lamination portion is formed to form a second coating film. The second coating film is heated or exposed. A portion other than a portion formed on the first lamination portion of the second coating film heated or exposed is removed, thereby forming a second lamination portion. The first composition includes: a first polymer; and a solvent. The first polymer includes: a first structural unit which includes an acid-labile group; and a functional group which selectively bonds to a metal atom or an Si—OH bond. The second composition includes: a second polymer including the first structural unit; an acid generating agent; and a solvent.

According to another aspect of the present invention, a composition includes a polymer, an acid generating agent, and a solvent. The polymer includes: a first structural unit which includes an acid-labile group; and a functional group which selectively bonds to a metal atom or an Si—OH bond.

DESCRIPTION OF EMBODIMENTS

Figure 1:
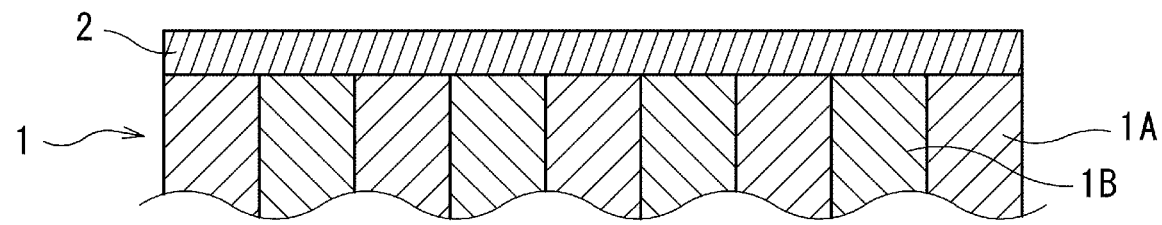
FIG. 1 is a schematic view illustrating a first composition-applying step in a pattern-forming method of an embodiment of the present invention.

In the formation of the pattern by the method as described in the background, steps required therefor tend to increase owing to multiple steps including: selectively adopting a base chemical modification accompanied by blocking performance against an ALD process, a CVD process, etc.; forming a metal oxide on regions of the base chemically unmodified by the ALD process, the CVD process or the like; and thereafter removing the chemical modification. Moreover, forming of a metal oxide requires equipment, instruments and the like for exclusive use in the ALD process, the CVD process, etc., whereby the steps tend to be complicated.

The present inventors conducted thorough investigation on the basis of the circumstances described above, and contrary to conventional idea, attained a conception of patterning the chemical modification per se, to be adopted to a base, in the method as described above, without employing the chemical modification as a blocking material for the ALD process, the CVD process, etc. The present inventors conducted further study on the basis of such a conception, and consequently accomplished the present invention.

According to an embodiment of the invention, a pattern-forming method includes: applying a first composition on a substrate having a surface layer including a first region which includes a metal atom, and a second region which includes a silicon atom; heating a first coating film formed by the applying of the first composition; removing a portion other than a portion formed on the first region or on the second region of the first coating film heated, thereby forming a first lamination portion; applying a second composition on the substrate comprising the first lamination portion formed thereon; heating or exposing a second coating film formed by the applying of the second composition; and removing a portion other than a portion formed on the first lamination portion of the second coating film heated or exposed, thereby forming a second lamination portion, wherein the first composition contains: a first polymer having a first structural unit which includes an acid-labile group, and a functional group which selectively bonds to a metal atom or an Si—OH bond; and a solvent, and the second composition contains: a second polymer having a first structural unit which includes an acid-labile group; an acid generating agent; and a solvent.

According to another embodiment of the present invention, a composition contains: a polymer having a first structural unit which includes an acid-labile group, and a functional group which selectively bonds to a metal atom or an Si—OH bond; an acid generating agent; and a solvent.

The pattern-forming method and the composition of the embodiments of the present invention enable formation of a pattern having a height in a regionally selective manner on certain regions of a base by a convenient procedure.

Hereinafter, the pattern-forming method and the composition of the embodiments of the present invention will be described in detail.

Pattern-Forming Method

The pattern-forming method includes steps of: applying a first composition on a substrate having a surface layer including a first region which includes a metal atom, and a second region which includes a silicon atom (hereinafter, may be also referred to as "first composition-applying step"); heating a first coating film formed by the applying step of the first composition (hereinafter, may be also referred to as "first coating film-heating step"); removing a portion other than a portion formed on the first region or on the second region of the first coating film heated, thereby forming a first lamination portion (hereinafter, may be also referred to as "first lamination portion-forming step"); applying a second composition on the substrate having the first lamination portion formed (hereinafter, may be also referred to as "second composition-applying step"); heating or exposing a second coating film formed by the applying step of the second composition (hereinafter, may be also referred to as "second coating film-heating/exposing step"); and removing a portion other than a portion formed on the first lamination portion of the second coating film heated or exposed, thereby forming a second lamination portion (hereinafter, may be also referred to as "second lamination portion-forming step").

Herein, a step which includes substeps from the first composition-applying step to the first lamination portion-forming step may be collectively referred to as a "first step", and a step which includes substeps from the second composition-applying step to the second lamination portion-forming step may be collectively referred to as a "second step".

In the first composition-applying step, a first composition is used which contains: a first polymer (hereinafter, may be also referred to as "(A1) polymer" or "polymer (A1)") having a first structural unit which includes an acid-labile group (hereinafter, may be also referred to as "acid-labile group (X)"), and a functional group which selectively bonds to a metal atom or an Si—OH bond (hereinafter, may be also referred to as "functional group (Y)"); and a solvent (hereinafter, may be also referred to as "(C1) solvent" or "solvent (C1)").

In the second composition-applying step, a second composition is used which contains: a second polymer (hereinafter, may be also referred to as "(A2) polymer" or "polymer (A2)") having a first structural unit which includes an acid-labile group (acid-labile group (X)); an acid generating agent (hereinafter, may be also referred to as "(B2) acid generating agent" or "acid generating agent (B2)"); and a solvent (hereinafter, may be also referred to as "(C2) solvent" or "solvent (C2)").

The pattern-forming method may further include, after the second step, a step (hereinafter, may be also referred to as "repeated step") of repeating a step similar to the second step. It is to be noted that the "repeating" as referred to herein means carrying out, after the second step, a similar step once or multiple times.

It is preferred that the first composition and the second composition used in the pattern-forming method are identical in light of more convenient execution of the pattern-forming method.

Due to including the first step and the second step, the pattern-forming method enables forming a pattern having a height in a regionally selective manner on certain regions of a base by a convenient method. Although not necessarily clarified and without wishing to be bound by any theory, the reason for achieving the effects described above by the pattern-forming method due to having the constitution described above may be presumed, for example, as in the following.

Regarding convenience, in the first step and the second step in the pattern-forming method, an operation of applying the composition followed by heating and/or exposing is conducted; accordingly, a complicated operation such as the ALD process or CVD process is not required.

The reason for achieving high regional selectivity may be presumed, for example, as in the following. In the first composition-applying step in the first step, the first composition, described later, is used. This first composition contains the first polymer, described later, and the first polymer has a functional group which selectively bonds to a metal atom or an Si—OH bond. This functional group is believed to result in high regional selectivity achieved by selectively bonding to the metal atom in the first region or the Si—OH bond in the second region of the surface layer of the substrate, depending on the type of the functional group.

The reason for enabling formation of a pattern having a height may be presumed, for example, as in the following. In the second composition-applying step in the second step, the second composition, described later, is used. The second composition contains the second polymer and the acid generating agent as described later, and the second polymer and the first polymer each have a first structural unit which includes an acid-labile group. In the second coating film-heating/exposing step in the second step, the acid-labile group is dissociated from the first structural unit included in each of the second polymer and the first polymer, due to an action of an acid generated from the acid generating agent upon heating or exposing. It is considered that graft polymerization then occurs at thus dissociated portions, resulting in lamination of the second lamination portion on the first lamination portion formed by the first step, thereby enabling an increase in height of the pattern.

Hereinafter, each step included in the pattern-forming method will be described in the order of the first step and the second step, and the repeated step with appropriate references to the drawings. The first step will be described in the order of the first composition-applying step, the first coating film-heating step, and the first lamination portion-forming step. The second step will be described in the order of the second composition-applying step, the second coating film-heating/exposing step, and the second lamination portion-forming step. It is to be noted that in the description of the pattern-forming method with reference to the drawings, one example in which a pattern is formed on the first region of a substrate is described; however, the pattern-forming method is not limited to this example, and the pattern may be formed on the second region of a substrate.

First Composition-Applying Step

This step is described with reference to FIG. 1. In this step, the first composition is applied on a substrate 1 having a surface layer including a first region which includes a metal atom 1A, and a second region which includes a silicon atom 1B. In this step, in light of further improvement of regional selectivity, it is preferred that the first composition is directly applied on the substrate 1. By this step, a first coating film 2 is formed on the substrate 1.

The application procedure of the first composition is not particularly limited, and is exemplified by a spin coating method, and the like.

Substrate

The substrate 1 has the surface layer including the first region 1A which includes the metal atom, and the second region 1B which includes the silicon atom. A mode of the arrangement of the first region and the second region on the substrate is not particularly limited, and is exemplified by, in a planar view: surficial shapes, spots, stripes, and other shapes. The sizes of the first region 1A and the second region 1B are not particularly limited, and regions having a desired size may be provided as appropriate.

The metal atom is not particularly limited as long as it is an atom of a metal element, and examples thereof include copper, iron, zinc, cobalt, aluminum, tin, tungsten, zirconium, titanium, tantalum, molybdenum, ruthenium, gold, silver, platinum, palladium, nickel and the like. Of these, copper, cobalt or tungsten is preferred. It is to be noted that a silicon atom is an atom of a nonmetal element and therefore does not fall under the category of the metal atom.

The metal atom may be present in the first region 1A of the surface layer of the substrate 1 in the form of, for example, a metal simple substance, an alloy, an electrically conductive nitride, a silicide, or the like.

Examples of the metal simple substance include simple substances of metals such as copper, iron, cobalt, tungsten, and tantalum, and the like.

Examples of the alloy include a nickel-copper alloy, a cobalt-nickel alloy, a gold-silver alloy, and the like.

Examples of the electrically conductive nitride include tantalum nitride, titanium nitride, iron nitride, aluminum nitride, and the like.

Examples of the silicide include iron silicide, molybdenum silicide, and the like.

Of these, the metal simple substance, the alloy, the electrically conductive nitride or the silicide is preferred; the metal simple substance or the electrically conductive nitride is more preferred; a copper simple substance, a cobalt simple substance, a tungsten simple substance, a tantalum simple substance, titanium nitride or tantalum nitride is still more preferred; and a copper simple substance, a cobalt simple substance or a tungsten simple substance is particularly preferred.

The silicon atom may be present in the second region 1B of the surface layer of the substrate 1 in the form of, for example, a silicon atom simple substance, an oxide, a nitride, a carbon-doped oxide, a carbide, a silicic acid ester, and the like.

Examples of the oxide include silicon dioxide and the like.

Examples of the nitride include silicon nitride and the like.

Examples of the carbon-doped oxide include carbon-doped silicon oxide (SiOC), and the like.

Examples of the carbide include SiC, and the like.

Examples of the silicic acid ester include tetraethyl orthosilicate (TEOS), and the like.

Of these, a silicon atom simple substance, the oxide, or the carbon-doped oxide is preferred.

In a case in which the first polymer contained in the first composition has the functional group which selectively bonds to an Si—OH bond as described later, it is preferred that the second region 1B has been subjected to a pretreatment. This pretreatment allows the Si—OH bond to be produced in the second region 1B. The pretreatment is not particularly limited as long as it is a treatment that enables Si—OH to be produced in the second region 1B, and is exemplified by a wet treatment, a dry treatment, and the like. A solution for use in the wet treatment is exemplified by an alcohol, an aqueous acid solution, an aqueous ammonium salt solution, a basic solution, an aqueous ammonium hydroxide-hydrogen peroxide solution (SC-1 washing liquid), and the like. The dry treatment is exemplified by a plasma treatment, a CVD treatment, and the like. It is to be noted that a necessity of the pretreatment may be appropriately determined in accordance with the mode of the presence of the silicon atom in the second region 1B.

First Composition

The first composition contains: a first polymer (polymer (A1)) having the first structural unit which includes the acid-labile group (acid-labile group (X)), and a functional group which selectively bonds to a metal atom or an Si—OH bond (functional group (Y)); and a solvent (solvent (C1)).

The first composition may also contain an acid generating agent (hereinafter, may be also referred to as "(B1) acid generating agent" or "acid generating agent (B1)"). In addition, the first composition may also contain optional component(s), within a range not leading to impairment of the effects of the present invention.

Each component contained in the first composition is described below in the order of the polymer (A1), the solvent (C1), the acid generating agent (B1), and the optional component.

(A1) Polymer

The polymer (A1) has the first structural unit which includes the acid-labile group (acid-labile group (X)), and the functional group which selectively bonds to a metal atom or an Si—OH bond (functional group (Y)). The "acid-labile group" as referred to herein means a group that substitutes for a hydrogen atom of a phenolic hydroxyl group or of a carboxy group, and is a group that is dissociated by an action of an acid. The "phenolic hydroxyl group" as referred to herein is not limited only to a hydroxy group directly bonding to a benzene ring, and means any hydroxy group directly bonding to an aromatic ring. The polymer (A1) may also have other structural unit(s) in addition to the first structural unit.

The polymer (A1) preferably has the acid-labile group (X) at an end of the side chain. As referred to herein, the "main chain" means a longest atom chain among atom chains that constitute the polymer, whereas the "side chain" as referred to herein means atom chains other than the main chain, among the atom chains constituting the polymer.

First Structural Unit

Examples of the first structural unit include a structural unit represented by the following formula (1-1), a structural unit represented by the following formula (1-2), and the like.

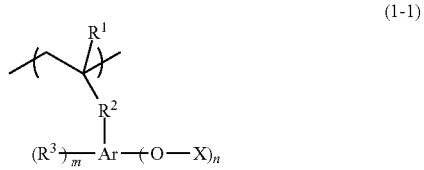

(1-1)

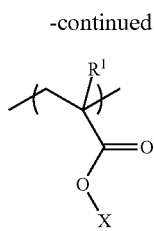

(1-2)

In the above formula (1-1) and the above formula (1-2), $R^1$ represents a hydrogen atom, a fluorine atom, a methyl group, or a trifluoromethyl group; and X represents the acid-labile group.

In the above formula (1-1), $R^2$ represents a single bond, —O—, —COO—, or —CONH—; Ar represents a group obtained by removing from an arene having 6 to 20 ring atoms, (m+n+1) hydrogen atoms on an aromatic ring thereof; m is an integer of 0 to 10, wherein in a case in which m is 1, $R^3$ represents a halogen atom or a monovalent organic group having 1 to 20 carbon atoms, in a case in which m is no less than 2, a plurality of $R^3$s are identical or different from each other and each $R^3$ represents a halogen atom or a monovalent organic group having 1 to 20 carbon atoms, or two or more of the plurality of $R^3$s taken together represent an alicyclic structure having 4 to 20 ring atoms, constituted together with the carbon chain to which the two or more of the plurality of $R^3$s bond; and n is an integer of 2 to 11, wherein a sum of m and n is no greater than 11, and in a case in which n is no less than 2, a plurality of Xs are identical or different from each other.

The number of "ring atoms" as referred to herein means the number of atoms constituting the ring in an alicyclic structure, an aromatic carbocyclic structure, an aliphatic heterocyclic structure or an aromatic heterocyclic structure, and in the case of a polycyclic ring structure, the number of "ring atoms" means the number of atoms constituting the polycyclic ring.

The "organic group" as referred to herein means a group which includes at least one carbon atom. The number of "carbon atoms" as referred to herein means the number of carbon atoms constituting a group.

Examples of the arene having 6 to 20 ring atoms that gives Ar include benzene, naphthalene, anthracene, phenanthrene, tetracene, pyrene, and the like. Of these, benzene or naphthalene is preferred, and benzene is more preferred.

The monovalent organic group having 1 to 20 carbon atoms which may be represented by $R^3$ is exemplified by: a monovalent hydrocarbon group having 1 to 20 carbon atoms; a group (α) that includes a divalent hetero atom-containing group between two adjacent carbon atoms of the monovalent hydrocarbon group having 1 to 20 carbon atoms; a group (β) obtained by substituting with a monovalent hetero atom-containing group a part or all of hydrogen atoms included in the monovalent hydrocarbon group having 1 to 20 carbon atoms or the group (α); a group (γ) obtained by combining a divalent hetero atom-containing group with the monovalent hydrocarbon group having 1 to 20 carbon atoms, the group (α), or the group (β); and the like.

The "hydrocarbon group" herein may include a chain hydrocarbon group, an alicyclic hydrocarbon group, or an aromatic hydrocarbon group. The "hydrocarbon group" may be either a saturated hydrocarbon group or an unsaturated hydrocarbon group. The "chain hydrocarbon group" as referred to herein means a hydrocarbon group not including a cyclic structure but being constituted with only a chain structure, and may be exemplified by a linear hydrocarbon group and a branched hydrocarbon group. The "alicyclic hydrocarbon group" as referred to herein means a hydrocarbon group that includes, as a ring structure, not an aromatic ring structure but an alicyclic structure alone, and may be exemplified by a monocyclic alicyclic hydrocarbon group and a polycyclic alicyclic hydrocarbon group. In this regard, it is not necessary for the alicyclic hydrocarbon group to be constituted with only an alicyclic structure; it may include a chain structure in a part thereof. The "aromatic hydrocarbon group" as referred to herein means a hydrocarbon group that includes an aromatic ring structure as a ring structure. In this regard, it is not necessary for the aromatic hydrocarbon group to be constituted with only an aromatic ring structure; it may include a chain structure and/or an alicyclic structure in a part thereof.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include: alkyl groups such as a methyl group, an ethyl group, an n-propyl group, and an i-propyl group; alkenyl groups such as an ethenyl group, a propenyl group, and a butenyl group; alkynyl groups such as an ethynyl group, a propynyl group, and a butynyl group; and the like.

Examples of the monovalent alicyclic hydrocarbon group having 3 to 20 carbon atoms include: alicyclic saturated hydrocarbon groups such as a cyclopentyl group, a cyclohexyl group, a norbornyl group, an adamantyl group, and a tricyclodecyl group; alicyclic unsaturated hydrocarbon groups such as a cyclopentenyl group, a cyclohexenyl group, a norbornenyl group, and a tricyclodecenyl group; and the like.

Examples of the monovalent aromatic hydrocarbon group having 6 to 20 carbon atoms include: aryl groups such as a phenyl group, a tolyl group, a xylyl group, and a naphthyl group; aralkyl groups such as a benzyl group, a phenethyl group, and a naphthylmethyl group; and the like.

The hetero atom constituting the monovalent hetero atom-containing group or the divalent hetero atom-containing group is exemplified by an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atom, and the like.

Examples of the divalent hetero atom-containing group include —O—, —CO—, —S—, —CS—, —NR'—, a combination of two or more of these, and the like, wherein R' represents a hydrogen atom or a monovalent hydrocarbon group.

Examples of the alicyclic structure having 4 to 20 ring atoms which may be represented by two or more of the plurality of $R^3$s taken together, constituted together with the carbon chain to which the two or more of the plurality of $R^3$s bond include: saturated alicyclic structures such as a cyclopentane structure, a cyclohexane structure, a norbornane structure, an adamantane structure, and a tricyclodecane structure; unsaturated alicyclic structures such as a cyclopentene structure, a cyclohexene structure, a norbornene structure, a norbornenyl group, and a tricyclodecene structure; and the like.

$R^1$ represents preferably a hydrogen atom or a methyl group.

$R^2$ represents preferably a single bond or —COO—, and more preferably a single bond.

$R^3$ represents preferably the monovalent hydrocarbon group, more preferably the monovalent chain hydrocarbon group, and still more preferably the alkyl group.

m is preferably 0 to 2, more preferably 0 or 1, and still more preferably 0.

n is preferably 1 to 3, more preferably 1 or 2, and still more preferably 1.

Examples of the acid-labile group represented by X include a group represented by the following formula (2-1), a group represented by the following formula (2-2), a group represented by the following formula (2-3), a group represented by the following formula (2-4), and the like.

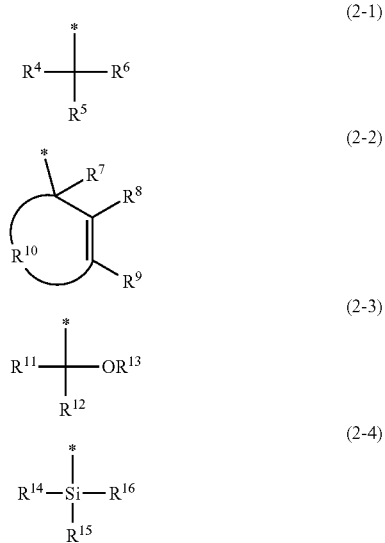

In the above formulae (2-1) to (2-4), * denotes a bonding site to the oxygen atom in the above formula (1-1) or (1-2).

In the above formula (2-1), $R^4$ represents a monovalent hydrocarbon group having 1 to 20 carbon atoms; $R^5$ and $R^6$ each independently represent a monovalent hydrocarbon group having 1 to 20 carbon atoms, or $R^5$ and $R^6$ taken together represent an alicyclic structure having 3 to 20 ring atoms, constituted together with the carbon atom to which $R^5$ and $R^6$ bond.

In the above formula (2-2), $R^7$ represents a hydrogen atom; $R^8$ and $R^9$ each independently represent a hydrogen atom or a monovalent hydrocarbon group having 1 to 20 carbon atoms; and $R^{10}$ represents a divalent hydrocarbon group having 1 to 20 carbon atoms constituting an unsaturated alicyclic structure having 4 to 20 ring atoms, together with the carbon atom to which $R^7$, $R^8$ and $R^9$ each bond.

In the above formula (2-3), $R^{11}$ and $R^{12}$ each independently represent a hydrogen atom or a monovalent hydrocarbon group having 1 to 20 carbon atoms; and $R^{13}$ represents a monovalent hydrocarbon group having 1 to 20 carbon atoms, or $R^{11}$ and $R^{12}$ taken together represent an alicyclic structure having 3 to 20 ring atoms, constituted together with the carbon atom to which $R^{11}$ and $R^{12}$ bond, or $R^{12}$ and $R^{13}$ taken together represent an aliphatic heterocyclic structure having 5 to 20 ring atoms, constituted together with the carbon atom to which $R^{12}$ bonds and with the oxygen atom to which $R^{13}$ bonds.

In the above formula (2-4), $R^{14}$, $R^{15}$ and $R^{16}$ each independently represent a monovalent hydrocarbon group having 1 to 20 carbon atoms.

Examples of the hydrocarbon group having 1 to 20 carbon atoms which may be represented by $R^4$, $R^5$, $R^6$, $R^8$, $R^9$, $R^{11}$, $R^{12}$, $R^{13}$, $R^{14}$, $R^{15}$ or $R^{16}$ include groups similar to the hydrocarbon group exemplified for $R^3$ in the above formula (1-1), and the like.

Examples of the alicyclic structure having 3 to 20 ring atoms which may be represented by $R^5$ and $R^6$ or $R^{11}$ and $R^{12}$ taken together, constituted together with the carbon atom to which $R^5$ and $R^6$ or $R^{11}$ and $R^{12}$ bond, respectively, include structures similar to the alicyclic structures exemplified as the alicyclic structure having 4 to 20 ring atoms which may be represented by two or more of the plurality of $R^3$s taken together, constituted together with the carbon chain to which the two or more of the plurality of $R^3$s bond in the above formula (1-1).

Examples of the divalent hydrocarbon group having 1 to 20 carbon atoms represented by $R^{10}$ include groups obtained by removing one hydrogen atom from the monovalent hydrocarbon group exemplified as $R^3$ in the above formula (1-1), and the like.

Examples of the unsaturated alicyclic structure having 4 to 20 ring atoms constituted by $R^{10}$ together with the carbon atom to which $R^7$, $R^8$ and $R^9$ each bond include structures similar to those exemplified in the case in which the alicyclic structure having 4 to 20 ring atoms which may be represented by the two or more of the plurality of $R^3$s taken together, constituted together with the carbon chain to which the two or more of the plurality of R3s bond in the above formula (1-1) is the unsaturated alicyclic structure.

Examples of the aliphatic heterocyclic structure having 5 to 20 ring atoms represented by $R^{12}$ and $R^{13}$ taken together, constituted together with the carbon atom to which $R^{12}$ bonds and with the oxygen atom to which $R^{13}$ bonds include: saturated oxygen-containing heterocyclic structures such as an oxacyclobutane structure, an oxacyclopentane structure, and an oxacyclohexane structure; unsaturated oxygen-containing heterocyclic structures such as an oxacyclobutene structure, an oxacyclopentene structure, and an oxacyclohexene structure; and the like.

$R^4$ represents preferably the chain hydrocarbon group or the aromatic hydrocarbon group, more preferably the alkyl group or the aryl group, still more preferably a methyl group or a phenyl group, and particularly preferably a methyl group.

$R^5$ and $R^6$ each represent preferably the chain hydrocarbon group or the alicyclic hydrocarbon group, more preferably the alkyl group or the alicyclic saturated hydrocarbon group, still more preferably a methyl group or an adamantyl group, and particularly preferably a methyl group. Furthermore, the alicyclic structure having 3 to 20 ring atoms, represented by $R^5$ and $R^6$ taken together, constituted together with the carbon atom to which $R^5$ and $R^6$ bond is preferably the saturated alicyclic structure, and more preferably a cyclopentane structure or a cyclohexane structure.

$R^8$ and $R^9$ each represent preferably a hydrogen atom or the chain hydrocarbon group, more preferably a hydrogen atom or the alkyl group, still more preferably a hydrogen atom or a methyl group, and particularly preferably a hydrogen atom.

The unsaturated alicyclic structure having 4 to 20 ring atoms constituted by $R^{10}$ together with the carbon atom to which $R^7$, $R^8$ and $R^9$ each bond is preferably a cyclopentene structure or a cyclohexene structure.

$R^{11}$ represents preferably a hydrogen atom.

$R^{12}$ represents preferably a hydrogen atom or the chain hydrocarbon group, more preferably a hydrogen atom or the alkyl group, and still more preferably a hydrogen atom or a methyl group.

$R^{13}$ represents preferably the chain hydrocarbon group, more preferably the alkyl group, and still more preferably a methyl group, an ethyl group, or a propyl group.

The aliphatic heterocyclic structure having 5 to 20 ring atoms represented by $R^{12}$ and $R^{13}$ taken together, constituted together with the carbon atom to which $R^{12}$ bonds and with the oxygen atom to which $R^{13}$ bonds is preferably the saturated oxygen-containing heterocyclic structure, and more preferably an oxacyclohexane structure.

The acid-labile group (X) is preferably the group represented by the above formula (2-1), the group represented by the above formula (2-3), or the group represented by the above formula (2-4), and more preferably the group represented by the above formula (2-1) or the group represented by the above formula (2-2).

Examples of the group represented by the above formula (2-1) include a group represented by the following formula (2-1-1), and the like. Examples of the group represented by the above formula (2-3) include a group represented by the following formula (2-3-1), a group represented by the following formula (2-3-2), a group represented by the following formula (2-3-3), a group represented by the following formula (2-3-4), and the like. Examples of the group represented by the above formula (2-4) include a group represented by the following formula (2-4-1), and the like.

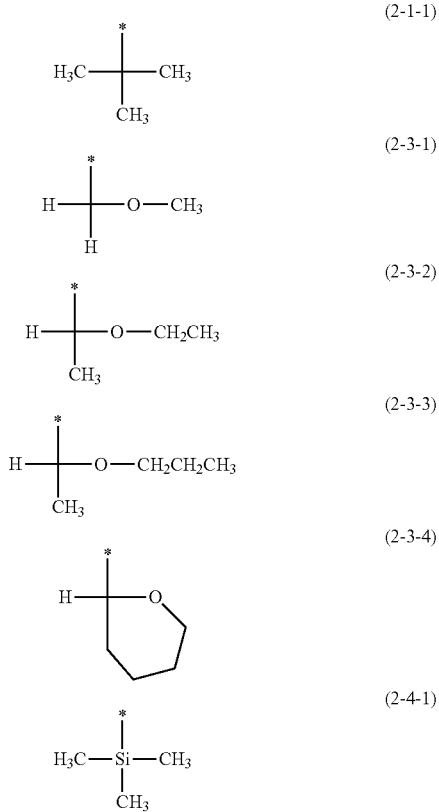

In the above formulae (2-1-1), (2-3-1), (2-3-2), (2-3-3), (2-3-4), and (2-4-1), * denotes a bonding site to the oxygen atom in the above formula (1-1) or formula (1-2).

The lower limit of a proportion of the first structural unit contained with respect to total structural units constituting the polymer (A1) is preferably 0.1 mol %, more preferably 1 mol %, still more preferably 5 mol %, and particularly preferably 10 mol %. The upper limit of the proportion is preferably 80 mol %, more preferably 50 mol %, still more preferably 40 mol %, and particularly preferably 30 mol %.

Other Structural Unit(s)

The other structural unit(s) is/are structural unit(s) other than the first structural unit. The other structural unit is exemplified by structural units such as a structural unit derived from substituted or unsubstituted styrene, a structural unit derived from (meth)acrylic acid or a (meth)acrylic acid ester, and the like, other than those falling under the category of the first structural unit. The polymer (A1) may have one, or two or more types of the other structural unit. The "(meth)acrylic acid" is a term referring collectively to "acrylic acid" and "methacrylic acid".

Examples of the monomer that gives the structural unit derived from substituted or unsubstituted styrene include styrene, α-methylstyrene, o-methylstyrene, m-methylstyrene, p-methylstyrene, p-t-butylstyrene, 2,4,6-trimethylstyrene, p-methoxystyrene, p-t-butoxystyrene, o-vinylstyrene, m-vinylstyrene, p-vinylstyrene, o-hydroxystyrene, m-hydroxystyrene, p-hydroxy styrene, m-chloromethylstyrene, p-chloromethylstyrene, p-chlorostyrene, p-bromostyrene, p-iodostyrene, p-nitrostyrene, p-cyano styrene, and the like.

Examples of the monomer that gives the structural unit derived from a (meth)acrylic acid ester include: (meth)acrylic acid alkyl esters such as methyl (meth)acrylate, ethyl (meth)acrylate, t-butyl (meth)acrylate, and 2-ethylhexyl (meth)acrylate; (meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate, and 2-(adamantan-1-yl)propyl (meth)acrylate; (meth)acrylic acid aryl esters such as phenyl (meth)acrylate and naphthyl (meth)acrylate; (meth)acrylic acid substituted alkyl esters such as 2-hydroxyethyl (meth)acrylate, 3-hydroxyadamantyl (meth)acrylate, glycidyl (meth)acrylate, 3-glycidylpropyl (meth)acrylate, and 3-trimethylsilylpropyl (meth)acrylate; and the like.

In a case in which the polymer (A1) has the other structural unit(s), the lower limit of a proportion of the other structural unit(s) contained with respect to total structural units constituting the polymer (A1) is preferably 20 mol %, more preferably 50 mol %, still more preferably 60 mol %, and particularly preferably 70 mol %. The upper limit of the proportion is preferably 99.9 mol %, more preferably 99 mol %, still more preferably 95 mol %, and particularly preferably 90 mol %.

Functional Group (Y)

The functional group (Y) is a functional group which selectively bonds to a metal atom or an Si—OH bond. The functional group (Y) is classified into a functional group which selectively bonds to a metal atom (hereinafter, may be also referred to as "functional group (Y-1)"), and a functional group which selectively bonds to Si—OH (hereinafter, may be also referred to as "functional group (Y-2)").

It is preferred that the polymer (A1) has the functional group (Y) at the end of the main chain thereof. When the polymer (A1) has the functional group (Y) at the end of the main chain thereof, regional selectivity to a certain region of the substrate can be further improved.

A bond between the functional group (Y-1) and the metal atom is a chemical bond, and is exemplified by a covalent bond, an ionic bond, a coordinate bond, and the like. Of these, a coordinate bond is preferred in light of greater bonding strength between the functional group (Y-1) and the metal atom.

The functional group (Y-1) is exemplified by a phosphonic acid group (—P(=O)(OH)$_2$), a phosphonic acid ester group, a cyano group, a sulfanyl group (—SH), a monohydroxyboryl group (—B(OH)), a phenolic hydroxyl group, a pyridine ring-containing group, an ethylenic carbon-carbon double bond-containing group, a carbon-carbon triple bond-containing group, and the like. Of these, in light of greater bonding strength between the functional group (Y-1) and the metal atom, a phosphonic acid group, a phosphonic acid ester group or a cyano group is preferred. The phosphonic acid ester group is exemplified by a phosphonic acid alkyl ester group, and the like.

A bond between the functional group (Y-2) and the Si—OH bond is a chemical bond, and is exemplified by a covalent bond, an ionic bond, a hydrogen bond, and the like. Of these, a covalent bond is preferred in light of greater bonding strength between the functional group (Y-2) and the Si—OH bond. The functional group (Y-2) is preferably a silanol group or a tertiary amino group.

In the case in which the polymer (A1) has the functional group (Y) at the end of the main chain thereof, the functional group (Y) at the end of the main chain can be introduced thereinto by, for example, polymerizing a monomer that gives the first structural unit or the like by a conventional procedure followed by treating the polymerization end with an end treatment agent that gives the functional group (Y).

The lower limit of a polystyrene equivalent weight average molecular weight (Mw) of the polymer (A1) as determined by gel permeation chromatography (GPC) is preferably 1,000, more preferably 2,000, still more preferably 4,000, and particularly preferably 4,500. The upper limit of the Mw is preferably 50,000, more preferably 30,000, still more preferably 15,000, and particularly preferably 8,000.

The Mw and Mn of the polymer as referred to herein are measured by gel permeation chromatography under the following conditions using GPC columns ("G2000 HXL"×2, "G3000 HXL"×1, and "G4000 HXL"×1) available from Tosoh Corporation.

eluent: tetrahydrofuran (FUJIFILM Wako Pure Chemical Corporation)
    flow rate: 1.0 mL/min
    sample concentration: 1.0% by mass
    amount of injected sample: 100 µL
    column temperature: 40° C.
    detector: differential refractometer
    standard substance: mono-dispersed polystyrene The lower limit of a proportion of the polymer (A1) contained with respect to total components other than the solvent (C1) in the first composition is preferably 80% by mass, more preferably 90% by mass, and still more preferably 95% by mass. The upper limit of the content is, for example, 100% by mass.

(C1) Solvent

The solvent (C1) is not particularly limited as long as it is a solvent capable of dissolving or dispersing at least the polymer (A1) and the other component(s), and is exemplified by an alcohol solvent, an ether solvent, a ketone solvent, an amide solvent, an ester solvent, a hydrocarbon solvent, and the like. The first composition may contain one, or two or more types of the solvent (C1).

Examples of the alcohol solvent include:
aliphatic monohydric alcohol solvents having 1 to 18 carbon atoms such as 4-methyl-2-pentanol and n-hexanol;
alicyclic monohydric alcohol solvents having 3 to 18 carbon atoms such as cyclohexanol;
polyhydric alcohol solvents having 2 to 18 carbon atoms such as 1,2-propylene glycol;
polyhydric alcohol partially etherated solvents having 3 to 19 carbon atoms such as propylene glycol monomethyl ether and propylene glycol monoethyl ether; and the like.

Examples of the ether solvent include:
dialkyl ether solvents such as diethyl ether, dipropyl ether, dibutyl ether, dipentyl ether, diisoamyl ether, dihexyl ether, and diheptyl ether;
cyclic ether solvents such as tetrahydrofuran and tetrahydropyran;
aromatic ring-containing ether solvents such as diphenyl ether and anisole (methyl phenyl ether); and the like.

Examples of the ketone solvent include:
chain ketone solvents such as acetone, methyl ethyl ketone, methyl-n-propyl ketone, methyl-n-butyl ketone, diethyl ketone, methyl-iso-butyl ketone (MIBK), 2-heptanone (methyl-n-pentyl ketone), ethyl-n-butyl ketone, methyl-n-hexyl ketone, di-iso-butyl ketone, and trimethylnonanone;
cyclic ketone solvents such as cyclopentanone, cyclohexanone, cycloheptanone, cyclooctanone, and methylcyclohexanone;
2,4-pentanedione, acetonylacetone, and acetophenone; and the like.

Examples of the amide solvent include:
cyclic amide solvents such as N,N'-dimethylimidazolidinone and N-methylpyrrolidone;
chain amide solvents such as N-methylformamide, N,N-dimethylformamide, N,N-diethylformamide, acetamide, N-methylacetamide, N,N-dimethylacetamide, and N-methylpropionamide; and the like.

Examples of the ester solvent include:
monocarboxylic acid ester solvents n-butyl acetate and ethyl lactate;
polyhydric alcohol carboxylate solvents such as propylene glycol acetate;
polyhydric alcohol partially etherated carboxylate solvents such as propylene glycol monomethyl ether acetate;
lactone solvents such as γ-butyrolactone and δ-valerolactone;
polyhydric carboxylic acid diester solvents such as diethyl oxalate;
carbonate solvents such as dimethyl carbonate, diethyl carbonate, ethylene carbonate, and propylene carbonate; and the like.

Examples of the hydrocarbon solvent include:
aliphatic hydrocarbon solvents having 5 to 12 carbon atoms such as n-pentane and n-hexane;
aromatic hydrocarbon solvents having 6 to 16 carbon atoms such as toluene and xylene; and the like.

In a case in which one type of the solvent (C1) is used, the alcohol solvent is preferred, the polyhydric alcohol partially etherated solvent is more preferred, and propylene glycol monomethyl ether or propylene glycol monoethyl ether is still more preferred. In a case in which two or more types of the solvents (C1) are used in combination, a combination of the alcohol solvent and an other solvent is preferred. The other solvent for use in combination with the alcohol solvent is preferably the ester solvent, more preferably the polyhydric alcohol partially etherated carboxylate solvent, and still more preferably propylene glycol monomethyl ether acetate.

By thus using at least the alcohol solvent as the solvent (C1), the height of the pattern to be formed can be further improved.

(B1) Acid Generating Agent

The acid generating agent (B1) is a compound that generates an acid by heating or exposing. The acid generating agent (B1) is not particularly limited and is exemplified by an onium salt compound, an N-sulfonyloxyimide compound, a halogen-containing compound, a diazomethane compound, a sulfone compound, a sulfonic acid ester compound, a carboxylic acid ester compound, a phosphoric acid ester compound, a sulfonebenzotriazole compound, and the like.

The onium salt compound is exemplified by a sulfonium salt, a tetrahydrothiophenium salt, an iodonium salt, a phosphonium salt, a pyridinium salt, a diazonium salt, an ammonium salt, and the like.

Examples of the sulfonium salt include a triphenylsulfonium salt, a 4-cyclohexylphenyldiphenylsulfonium salt, a 4-t-butylphenyldiphenylsulfonium salt, a tri(4-t-butylphenyl)sulfonium salt, and the like.

Examples of the tetrathiophenium salt include a 1-(4-n-butoxynaphthalen-1-yl)tetrahydrothiophenium salt, a 1-(3,5-dimethyl-4-hydroxyphenyl)tetrahydrothiophenium salt, a 1-(4,7-dibutoxy-1-naphthalenyl)tetrahydrothiophenium salt, and the like.

Examples of the iodonium salt include a diphenyliodonium salt, a di(t-butylphenyl)iodonium salt, and the like.

Examples of a counter anion of these onium salt compounds include: fluorinated alkylsulfonates such as methanesulfonate, trifluoromethanesulfonate, and nonafluorobutanesulfonate; sulfonate ions such as camphorsulfonate and a p-toluenesulfonate ion; phosphate ions such as a hexafluorophosphate ion; borate ions such as a tetrafluoroborate ion; antimonate ions such as a hexafluoroantimonate ion; arsenate ions such as a hexafluoroarsenate ion; and the like.

The acid generating agent (B1) is preferably the onium salt compound, more preferably the iodonium salt, still more preferably the di(t-butylphenyl)iodonium salt, and particularly preferably di(t-butylphenyl)iodonium nonafluorobutanesulfonate.

The lower limit of a content of the acid generating agent (B1) in the first composition with respect to 100 parts by mass of the polymer (A1) is preferably 0.1 parts by mass, more preferably 0.5 parts by mass, still more preferably 1 part by mass, and particularly preferably 2 parts by mass. The upper limit of the content is preferably 30 parts by mass, more preferably 25 parts by mass, still more preferably 20 parts by mass, and particularly preferably 15 parts by mass.

Preparation Procedure of First Composition

The first composition may be prepared by, for example, mixing the polymer (A1), the solvent (C1) and as needed, the other component(s) in a predetermined ratio, preferably followed by filtering the mixture through a high-density polyethylene filter or the like having fine pores of no greater than 0.45 μm. The lower limit of a solid content concentration of the first composition is preferably 0.1% by mass, more preferably 0.5% by mass, and still more preferably 0.7% by mass. The upper limit of the solid content concentration is preferably 30% by mass, more preferably 10% by mass, and still more preferably 3% by mass. The "solid content concentration" as referred to means a concentration (% by mass) of all components other than the solvent (C1) in the first composition.

First Coating Film-Heating Step

Figure 2:
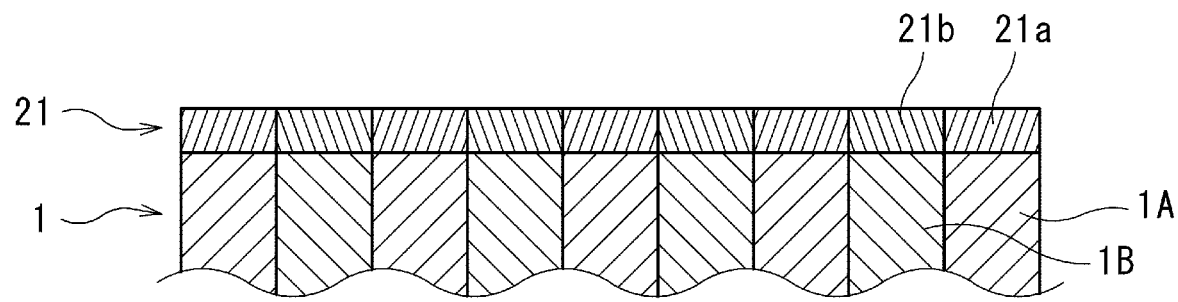
FIG. 2 is a schematic view illustrating a first coating film-heating step in the pattern-forming method.

This step is explained with reference to FIG. 2. In this step, the first coating film 2 formed by the first composition-applying step is heated. By this step, formation of bonding between depending on the type of the functional group (Y) included in the polymer (A1) contained in the first composition used in the first composition-applying step, either the first region 1A or the second region 1B of the surface layer of the substrate 1, and a portion of the first coating film 2 formed thereon is accelerated, whereby a first film 21 is formed. For example, in a case in which the first composition containing the first polymer having the functional group (Y-1) is used in the first composition-applying step, the first film 21 includes: a region (first bonding region 21a) where adhesiveness to the first region 1A of the surface layer of the substrate 1 is high; and a region (first unbonded region 21b) where adhesiveness to the second region 1B of the surface layer of the substrate 1 is low. This feature is considered to result from bonding of the functional group (Y-1) to the metal atom in the first region 1A, leading to, of the first film 21, enhanced adhesiveness of the first region 1A of the surface layer of the substrate 1 to the first bonding region 21a, with lowered adhesiveness of region(s) other than the first region 1A, such as the second region 1B, to the first unbonded region 21b.

The lower limit of a temperature of the heating is preferably 80° C., more preferably 100° C., and still more preferably 130° C. The upper limit of the temperature of the heating is preferably 300° C., more preferably 250° C., and still more preferably 200° C. The lower limit of a time period of the heating is preferably 10 sec, more preferably 1 min, and still more preferably 2 min. The upper limit of the time period of the heating is preferably 120 min, more preferably 10 min, and still more preferably 5 min. Means for the heating is not particularly limited, and common heating means such as, e.g., an oven or a hot plate may be used.

An average thickness of the first film 21 formed by this step may be adjusted to a desired value by appropriately selecting a type and a concentration of the polymer (A1) in the first composition, and conditions such as a heating temperature and a heating time period in the first coating film-heating step. The lower limit of the average thickness of the first film 21 is preferably 0.1 nm, more preferably 1 nm, and still more preferably 3 nm. The upper limit of the average thickness is, for example, 20 nm. It is to be noted that the average thickness of the first film 21 is a value measured using a spectroscopic ellipsometer ("M2000D" available from J. A. WOOLLAM Co.).

First Lamination Portion-Forming Step

Figure 3:
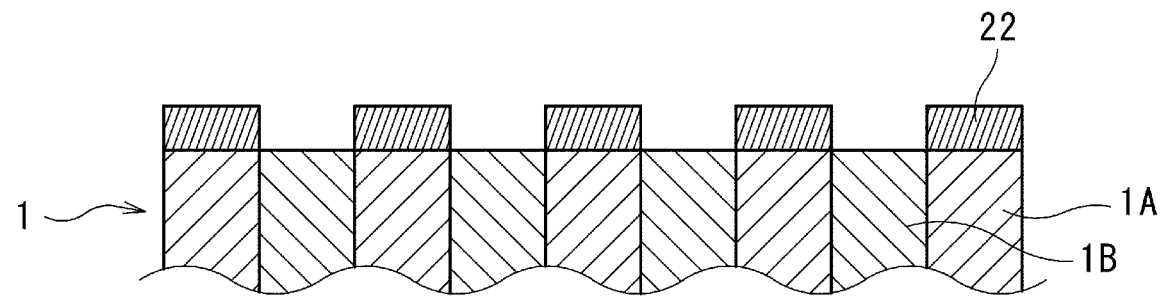
FIG. 3 is a schematic view illustrating a first lamination portion-forming step in the pattern-forming method.

This step is explained with reference to FIG. 3. In this step, of the first coating film 2 (first film 21) heated, a portion other than a portion formed on the first region 1A or on the second region 1B is removed to form a first lamination portion 22. The first film 21 formed in the first coating film-heating step includes: a region (first bonding region 21a) where adhesiveness to the first region 1A of the surface layer of the substrate 1 is high; and a region (first unbonded region 21b) where adhesiveness to the second region 1B of the surface layer of the substrate 1 is low, as described above; therefore, of the first film 21, the first unbonded region 21b is removed in this step. Accordingly, only the first bonding region 21a on the first region 1A of the surface layer of the substrate 1 remains, whereby the first lamination portion 22 is formed on the first region 1A of the surface layer of the substrate 1.

A removing procedure of the first unbonded region 21b is not particularly limited, and, for example, a procedure of washing with a rinse agent, or the like may be employed. Washing with the rinse agent is preferred since convenience of the operation can be further enhanced.

As the rinse agent, an organic solvent is usually used. Examples of the organic solvent include solvents similar to those exemplified for the solvent (C1), and the like.

Second Composition-Applying Step

Figure 4:
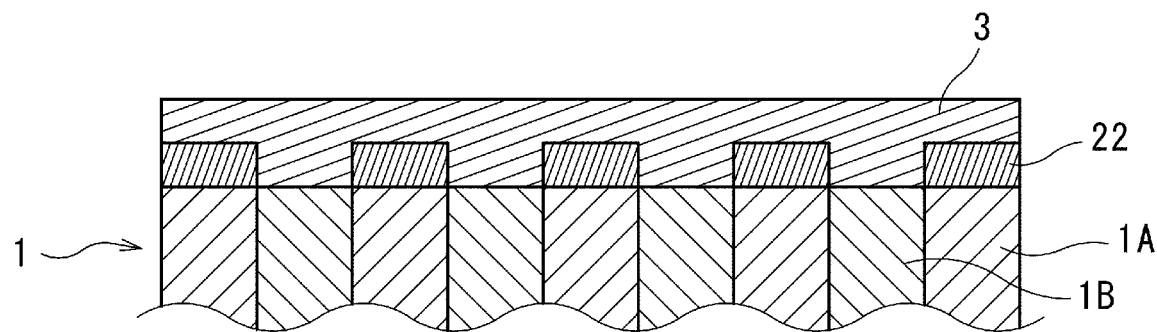
FIG. 4 is a schematic view illustrating a second composition-applying step in the pattern-forming method.

This step is explained with reference to FIG. 4. In this step, the second composition is applied on the substrate 1 having the first lamination portion 22 formed in the first step. By this step, a second coating film 3 is formed on the substrate 1. More specifically, by this step, the second coating film 3 is formed on the substrate 1 irrespective of regions on the substrate 1 on which the first lamination portion 22 has or has not been formed.

The application procedure of the second composition is not particularly limited, and is exemplified by procedures similar to those exemplified in the first composition-applying step, and the like.

Second Composition

The second composition contains: a second polymer (polymer (A2)) having a first structural unit which includes the acid-labile group (acid-labile group (X)); an acid generating agent (acid generating agent (B2)); and a solvent (solvent (C2)). The second composition may also contain optional component(s) within a range not leading to impairment of the effects of the embodiment of the present invention.

Each component contained in the second composition is explained in the following.

(A2) Polymer

The polymer (A2) has the first structural unit which includes the acid-labile group (X). In the case of the polymer (A2), unlike the polymer (A1), the functional group (Y) is not an essential constituent; however, it is preferred that the polymer (A2) includes the functional group (Y), in light of more conveniently carrying out an operation, provision and the like of the production method of the patterned substrate. Additionally, in the case in which the polymer (A2) has the functional group (Y), the functional group (Y) included in the polymer (A2) preferably falls within the same category as that of the functional group (Y) included in the polymer (A1), in light of forming of the pattern in a more regionally selective manner. To give an example, in the case in which the polymer (A1) has the functional group (Y-1), the functional group (Y) included in the polymer (A2) is preferably the functional group (Y-1). The polymer (A2) may also have the other structural unit(s) aside from the first structural unit.

The acid-labile group (X) is as described above in the section "(A1) Polymer", with regard to the first structural unit, the functional group (Y) and the other structural unit.

(B2) Acid Generating Agent

The acid generating agent (B2) is as described above in the section "(B1) Acid Generating Agent".

(C2) Solvent

The solvent (C2) is as described above in the section "(C1) Solvent".

Preparation Procedure of Second Composition

The second composition may be prepared similarly to the first composition. The lower limit of a solid content concentration of the second composition is preferably 0.1% by mass, more preferably 0.5% by mass, and still more preferably 0.7% by mass. The upper limit of the solid content concentration is preferably 30% by mass, more preferably 10% by mass, and still more preferably 3% by mass. The "solid content concentration" as referred to herein means a concentration (% by mass) of total components other than the solvent (C2) in the second composition.

Second Coating Film-Heating/Exposing Step

Figure 5:
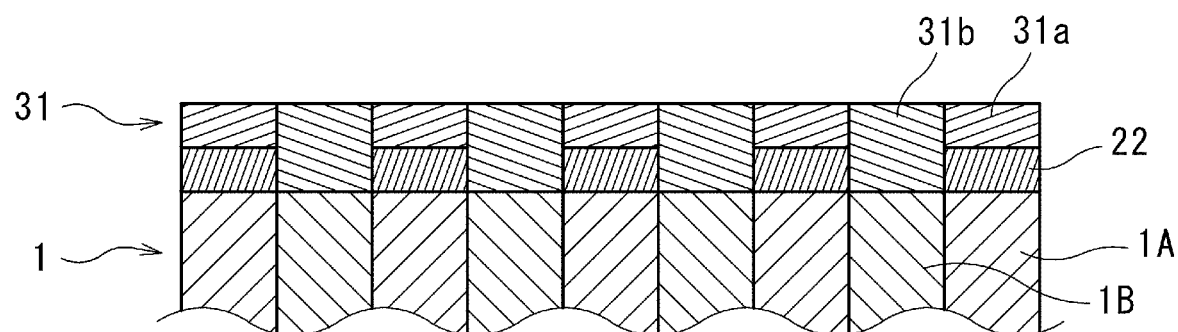
FIG. 5 is a schematic view illustrating a second coating film-heating/exposing step in the pattern-forming method.

This step is explained with reference to FIG. 5. In this step, the second coating film 3 formed by the second composition-applying step is heated or exposed. By this step, bonding is formed between the first lamination portion 22 and a portion, of the second coating film 3, formed on the first lamination portion 22 formed in the first step, whereby a second film 31 is formed. The second film 31 includes: a region (second bonding region 31a) where adhesiveness to the first lamination portion 22 is high; and a region (second unbonded region 31b) where adhesiveness to the second region 1B of the surface layer of the substrate 1 is low. In this regard, it is considered that: due to an action of the acid generated from the acid generating agent (B2) by heating or exposing, the acid-labile group (X) is dissociated from the first structural unit included in each of the polymer (A1) constituting the first lamination portion 22, and the polymer (A2) constituting the second bonding region 31a; and then a portion subjected to such dissociation undergoes graft polymerization, thereby leading to enhanced adhesiveness between the first lamination portion 22 and the second bonding region 31a.

Heating or exposing of the second coating film 3 may be appropriately determined depending on the type and the like of the acid generating agent (B2) used. For example, determination may be made by, e.g.: conducting heating in a case in which a heat acid generating agent is used as the acid generating agent (B2); and conducting exposing in a case in which a photo acid generating agent is used as the acid generating agent (B2). Also, there are some types of the acid generating agent (B2) falling under both categories of the heat acid generating agent and the photo acid generating agent. In a case in which such an acid generating agent is used, either only the heating or only the exposing may be carried out, or a combination of heating and exposing may be adopted. In light of more conveniently carrying out the second coating film-heating/exposing step, selecting either heating or exposing is preferable to combining heating and exposing.

Conditions of the heating are not particularly limited as long as generation of the acid from the acid generating agent (B2) is enabled, and may be appropriately determined depending on the type and the like of the acid generating agent (B2) used. The lower limit of a temperature of the heating is preferably 100° C., more preferably 150° C., and still more preferably 180° C. The upper limit of the temperature is preferably 500° C., more preferably 400° C., and still more preferably 300° C. The lower limit of a time period of the heating is preferably 10 sec, more preferably 1 min, and still more preferably 2 min. The upper limit of the time period of the heating is preferably 120 min, more preferably 10 min, and still more preferably 5 min. Means for carrying out the heating is not particularly limited, and for example, means similar to those exemplified for the first coating film-heating step may be exemplified.

A radioactive ray for use in the exposing may be appropriately selected depending on the type of the acid generating agent (B2), and examples of the radioactive ray include: electromagnetic waves such as visible light rays, ultraviolet rays, far ultraviolet rays, X-rays, and γ-rays; particle rays such as electron beams, molecular beams, and ion beams; and the like. Of these, far ultraviolet rays are preferred, and a KrF excimer laser beam (248 nm), an ArF excimer laser beam (193 nm), an $F_2$ excimer laser beam (wavelength: 157 nm), a $Kr_2$ excimer laser beam (wavelength: 147 nm), an ArKr excimer laser beam (wavelength: 134 nm), and extreme ultraviolet rays (wavelength: 13.5 nm, EUV) are more preferred. Conditions of exposing are not particularly limited as long as generation of the acid from the acid generating agent (B2) is enabled, and may be appropriately determined depending on the type and the like of the acid generating agent (B2) used.

Second Lamination Portion-Forming Step

Figure 6:
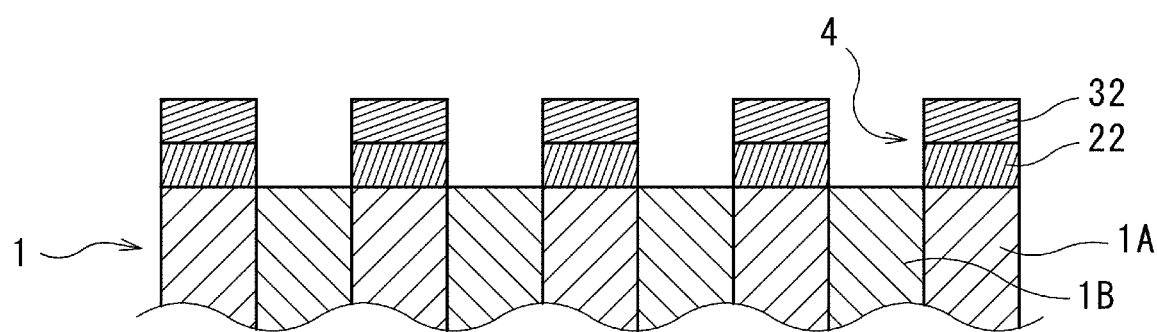
FIG. 6 is a schematic view illustrating a second lamination portion-forming step in the pattern-forming method.

This step is explained with reference to FIG. 6. In this step, of the second coating film 3 (second film 31) which was heated or exposed, a portion other than a portion formed on the first lamination portion 22 is removed to form a second lamination portion 32. The second film 31 formed by the second coating film-heating/exposing step as described above includes the region (second bonding region 31a) where adhesiveness to the first lamination portion 22 is high; and the region (second unbonded region 31b) where adhesiveness to the second region 1B of the surface layer of the substrate 1 is low, as described above; therefore, in this step, of the second film 31, the second unbonded region 31b is removed. Accordingly, of the second film 31, only the second bonding region 31a on the first lamination portion 22 remains, whereby the second lamination portion 32 is formed on the first lamination portion 22. As a result, formation of a lamination pattern 4 having protruding parts is enabled on the substrate 1, the lamination pattern 4 including the first lamination portion 22 and the second lamination portion 32 laminated, in this order, on the first region 1A of the surface layer of the substrate 1.

Similarly to the first lamination portion-forming step, a procedure for removing the second unbonded region 31b is not particularly limited, and, for example, a procedure of washing with a rinse agent, or the like may be employed. Washing with the rinse agent is preferred since convenience of the operation can be further enhanced.

As the rinse agent, an organic solvent is usually used. Examples of the organic solvent include organic solvents similar to those exemplified in "Solvent (C1)", and the like.

Repeated Step

In this step, after the second step, a step similar to the second step is further repeated. By this step, a height of the lamination pattern 4 formed by the first step and the second step can be increased. More specifically, on the second lamination portion 32, laminating of a third lamination portion and a fourth lamination portion, etc., depending on number of times of the repeating, can increase the height of the lamination pattern 4. The number of times of the repeating is not particularly limited, and may be once or multiple times (twice or more), and may be determined depending on the height of the pattern desired.

This step includes steps similar to the second step, i.e., a second composition-applying step, a second coating film-heating/exposing step, and a second lamination portion-forming step. It is to be noted that in the following, with respect to the steps similar to the second step in this step, a step number is raised depending on the number of times of the repeated step; for example, for steps carried out immediately after the second step, a "third step", a "third composition", and the like are referred to.

Various conditions and the composition employed following the third step may be similar to or different from those in the second step. In light of more conveniently performing the pattern-forming method of the embodiment of the invention, the various conditions and the composition are preferably similar to those in the second step.

Composition

The composition of the embodiment of the invention contains: a polymer (hereinafter, may be also referred to as "(A) polymer" or "polymer (A)") having a first structural unit which includes the acid-labile group (acid-labile group (X)), and a functional group which selectively bonds to a metal atom or an Si—OH bond (functional group (Y)); an acid generating agent (hereinafter, may be also referred to as "(B) acid generating agent" or "acid generating agent (B)"); and a solvent (hereinafter, may be also referred to as "(C) solvent" or "solvent (C)"). The composition may also contain optional component(s) within a range not leading to impairment of the effects of the present invention.

The composition enables forming of a pattern having a height in a regionally selective manner on certain regions of the substrate, by a convenient method. Therefore, the composition of the embodiment of the present invention can be suitably used as a composition for use in the pattern-forming method described above. In other words, the composition can be suitably used as a composition for forming a pattern in a regionally selective manner on a substrate having a surface layer including a first region which includes a metal atom and a second region which includes a silicon atom.

Since the composition contains: the polymer (A) having the first structural unit and functional group (Y) which includes the acid-labile group (X); and the acid generating agent (B), the composition can be used as the first composition for use in the pattern-forming method first composition-applying step described above, or as the second composition for use in the second composition-applying step. In the case in which the composition is thus used in the pattern-forming method described above, more convenient operation is enabled.

Each component contained in the composition is explained in the following.

(A) Polymer

The polymer (A) has the first structural unit which includes the acid-labile group (X), and the functional group which selectively bonds to a metal atom or an Si—OH bond (Y). The acid-labile group (X), the first structural unit, and the functional group (Y) are described, respectively, in the sections "(A1) Polymer" and "(A2) Polymer" in the pattern-forming method described above.

The content, the Mw and the Mw/Mn of the polymer (A) in the composition are similar to those described in the sections "(A1) Polymer" and "(A2) Polymer" in the pattern-forming method described above.

(B) Acid Generating Agent

The acid generating agent (B) is similar to those described in the sections "(B1) Acid Generating Agent" and "(B2) Acid Generating Agent" in the pattern-forming method described above.

(C) Solvent

The solvent (C) is similar to those described in the sections "(C1) Solvent" and "(C2) Solvent" in the pattern-forming method described above.

Optional Component(s)

The optional component(s) is/are similar to the optional component(s) which may be contained in the first composition or the second composition in the pattern-forming method described above.

Preparation Procedure of Composition

The composition may be prepared similarly to the first composition and the second composition in the pattern-forming method described above. The lower limit of a solid content concentration of the composition is preferably 0.1% by mass, more preferably 0.5% by mass, and still more preferably 0.7% by mass. The upper limit of the solid content concentration is preferably 30% by mass, more preferably 10% by mass, and still more preferably 3% by mass. The "solid content concentration" as referred to herein means a concentration (% by mass) of total components other than the solvent (C) in the composition.

EXAMPLES

Hereinafter, the present invention is explained in detail by way of Examples, but the present invention is not in any way limited to these Examples. Measuring methods for various types of physical properties are shown below.

Weight Average Molecular Weight (Mw), Number Average Molecular Weight (Mn) and Dispersity Index (Mw/Mn)

The Mw and the Mn of the polymer were measured by gel permeation chromatography (GPC) using GPC columns ("G2000 HXL"×2, "G3000 HXL"×1 and "G4000 HXL"×1) available from Tosoh Corporation, under the following conditions.

eluent: tetrahydrofuran (FUJIFILM Wako Pure Chemical Corporation)
  flow rate: 1.0 mL/min
  sample concentration: 1.0% by mass
  amount of injected sample: 100 μL
  column temperature: 40° C.
  detector: differential refractometer
  standard substance: mono-dispersed polystyrene

Synthesis of Polymer (A)

Synthesis Example 1: Synthesis of Polymer (A-1) (PtBuOSt-r-PS-ω-PO3Et2)

After a 500-mL flask as a reaction vessel was dried under reduced pressure, 120 g of tetrahydrofuran (hereinafter, may be also referred to as "THF") which had been subjected to a distillation dehydrating treatment was charged thereinto in a nitrogen atmosphere and cooled to −78° C. Thereafter, 2.00 mL of a 1 N cyclohexane solution of sec-butyllithium (hereinafter, may be also referred to as "sec-BuLi") was charged into this THF, and then 8.1 mL of styrene and 3.5 mL of 4-tert-butoxystyrene which had been subjected to: adsorptive filtration by means of silica gel for removing a polymerization inhibitor; and a dehydration treatment by distillation were added dropwise over 30 min while the internal temperature of the reaction mixture was carefully controlled so as not to be −60° C. or greater, followed by stirring of the mixture for 90 min. Subsequently, 0.28 mL of diethyl chlorophosphate was charged to allow for a termination reaction of the polymerization end. The temperature of the reaction mixture was elevated to room temperature and the reaction solution thus obtained was concentrated, and replacement with methyl isobutyl ketone (hereinafter, may be also referred to as "MIBK") was conducted. Thereafter, 200 g of a 2% by mass aqueous oxalic acid solution was charged, followed by stirring. After the resulting mixture was left to stand, the aqueous underlayer was removed. This operation was repeated four times to remove a lithium salt. Thereafter, 200 of ultrapure water was charged, a resultant mixture was stirred, and then an aqueous underlayer was removed. After this operation was repeated three times to remove oxalic acid, a solution thus obtained was concentrated and then dropped into 400 g of methanol to precipitate a polymer, and the solid was collected on a Buechner funnel. This polymer was dried under reduced pressure at 60° C. to give 10.2 g of a white polymer represented by the following formula (A-1) (hereinafter, may be also referred to as "polymer (A-1)" or "PtBuOSt-r-PS-ω-PO3Et2").

With respect to this polymer (A-1): the Mw was 5,800; the Mn was 5,500; and the Mw/Mn was 1.05.

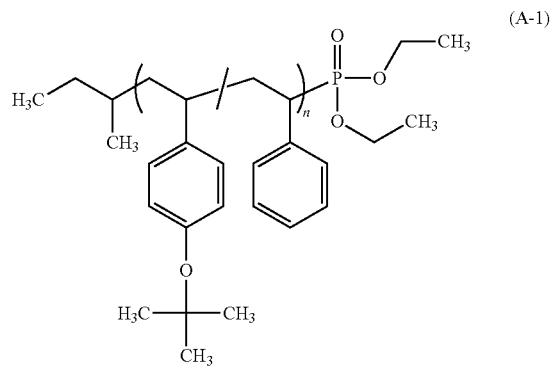

(A-1)

Synthesis Example 2: Synthesis of Polymer (A-2) (PtBuOSt-r-PS-ω-PO3H2)

To 10.0 g of the polymer (A-1) obtained in Synthesis Example 1, 0.81 g of triethylamine, 4 g of propylene glycol monomethyl ether, and 40 g of propylene glycol monomethyl ether acetate were added, and a resulting mixture was heated with stirring in a nitrogen atmosphere at 80° C. This reaction solution was cooled to room temperature and the reaction solution thus obtained was concentrated, and replacement with MIBK was conducted. Thereafter, 200 g of a 2% by mass aqueous oxalic acid solution was charged, followed by stirring. After the resulting mixture was left to stand, the aqueous underlayer was removed. This operation was repeated three times to remove a salt of triethylamine. Thereafter, 200 g of ultrapure water was charged, and then an aqueous underlayer was removed. After this operation was repeated four times to remove oxalic acid, a solution thus obtained was concentrated and then dropped into 400 g of methanol to precipitate a polymer, and the solid was collected on a Buechner funnel. This polymer was dried under reduced pressure at 60° C. to give 8.7 g of a white polymer represented by the following formula (A-2) (hereinafter, may be also referred to as "polymer (A-2)" or "PtBuOSt-r-PS-ω-PO3H2").

With respect to this polymer (A-2): the Mw was 5,700; the Mn was 5,400; and the Mw/Mn was 1.05.

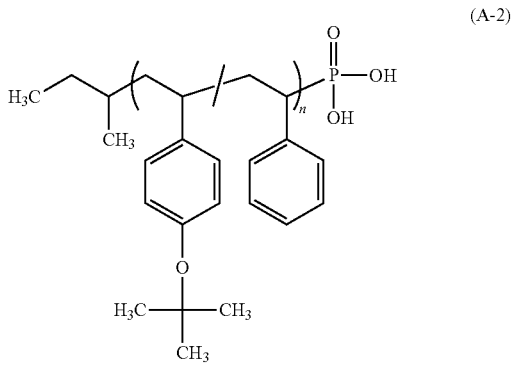

(A-2)

Synthesis Example 3: Synthesis of Polymer (A-3) (PtBuOSt-r-PS-ω-CN)

After a 500 mL flask as a reaction vessel was dried under reduced pressure, 120 g of THF which had been subjected to a distillation dehydrating treatment was charged thereinto in a nitrogen atmosphere, and cooled to −78° C. Thereafter, 2.00 mL of a 1 N cyclohexane solution of sec-BuLi was charged into this THF, and thereto was further added 7.9 mL of a 0.5 N tetrahydrofuran solution of lithium chloride. Thereafter, 8.1 mL of styrene and 3.5 mL of 4-tert-butoxystyrene which had been subjected to: adsorptive filtration by means of silica gel for removing a polymerization inhibitor; and a dehydration treatment by distillation were added dropwise over 30 min while the internal temperature of the reaction mixture was carefully controlled so as not to be −60° C. or greater, followed by stirring of the mixture for 90 min. Subsequently, 0.16 mL of 3-bromopropionitrile was charged to allow for a termination reaction of the polymerization end. The temperature of the reaction mixture was elevated to room temperature and the reaction solution thus obtained was concentrated, and replacement with MIBK was conducted. Thereafter, 200 g of a 2% by mass aqueous oxalic acid solution was charged, followed by stirring. After the resulting mixture was left to stand, the aqueous underlayer was removed. This operation was repeated three times to remove a lithium salt. Thereafter, 200 of ultrapure water was charged, a resultant mixture was stirred, and then an aqueous underlayer was removed. After this operation was repeated four times to remove oxalic acid, a solution thus obtained was concentrated and then dropped into 400 g of methanol to precipitate a polymer, and the solid was collected on a Buechner funnel. This polymer was dried under reduced pressure at 60° C. to give 10.3 g of a white polymer represented by the following formula (A-3) (hereinafter, may be also referred to as "polymer (A-3)" or "PtBuOSt-r-PS-ω-CN").

With respect to this polymer (A-3): the Mw was 6,000; the Mn was 5,600; and the Mw/Mn was 1.07.

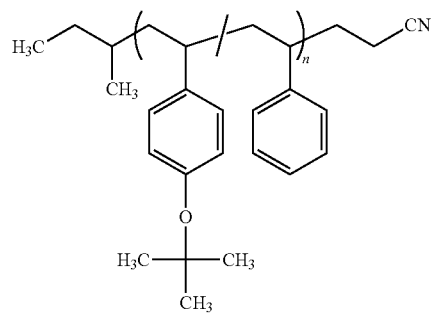

(A-3)

Synthesis Example 4: Synthesis of Polymer (A-4) (PtBuOSt-r-PS-ω-SiOH)

After a 500 mL flask as a reaction vessel was dried under reduced pressure, 120 g of THF which had been subjected to a distillation dehydrating treatment was charged thereinto in a nitrogen atmosphere, and cooled to −78° C. Thereafter, 2.20 mL of a 1 N cyclohexane solution of sec-BuLi was charged into this THF, and then 8.1 mL of styrene and 3.5 mL of 4-tert-butoxystyrene which had been subjected to: adsorptive filtration by means of silica gel for removing a polymerization inhibitor; and a dehydration treatment by distillation were added dropwise over 30 min while the internal temperature of the reaction mixture was carefully controlled so as not to be −60° C. or greater, followed by stirring of the mixture for 90 min. Next, 1.0 g of hexamethylcyclotrisiloxane in a form of a solid was added, and the temperature of the mixture was equilibrated to a normal temperature and then the mixture was stirred. Sixty minutes later, 1 mL of methanol was charged to allow for a termination reaction of the polymerization end. A resulting reaction solution was concentrated, and replacement with MIBK was conducted. Thereafter, 200 g of ultra pure water was charged, followed by stirring. After the resulting mixture was left to stand, the aqueous underlayer was removed. This operation was repeated six times to remove a lithium salt. A solution thus obtained was concentrated and then dropped into 400 g of methanol to precipitate a polymer, and the solid was collected on a Buechner funnel. This polymer was dried under reduced pressure at 60° C. to give 11.3 g of a white polymer represented by the following formula (A-4) (hereinafter, may be also referred to as "polymer (A-4)" or "PtBuOSt-r-PS-ω-SiOH").

With respect to this polymer (A-4): the Mw was 5,400; the Mn was 5,100; and the Mw/Mn was 1.06.

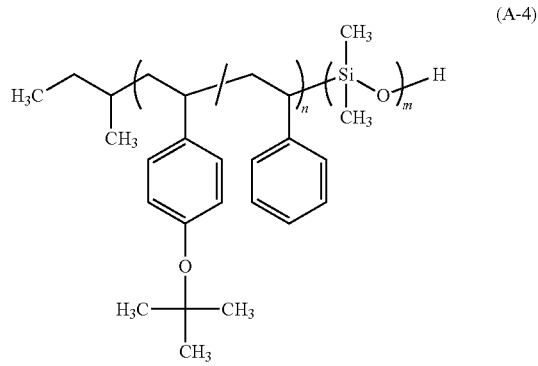

(A-4)

Synthesis Example 5: Synthesis of Polymer (A-5) (PtBuOSt-r-PS-ω-NEt2)

After a 500 mL flask as a reaction vessel was dried under reduced pressure, 120 g of THF which had been subjected to a distillation dehydrating treatment was charged thereinto in a nitrogen atmosphere, and cooled to −78° C. Thereafter, 2.00 mL of a 1 N cyclohexane solution of sec-BuLi was charged into this THF, and then 8.1 mL of styrene and 3.5 mL of 4-tert-butoxystyrene which had been subjected to: adsorptive filtration by means of silica gel for removing a polymerization inhibitor; and a dehydration treatment by distillation were added dropwise over 30 min while the internal temperature of the reaction mixture was carefully controlled so as not to be −60° C. or greater, followed by stirring of the mixture for 90 min. Subsequently, 0.32 mL of chloro-N,N-diethylaminopropane was charged and the mixture was stirred for 120 min to allow for a termination reaction of the polymerization end. The temperature of the reaction mixture was elevated to room temperature and the reaction solution thus obtained was concentrated, and replacement with MIBK was conducted. Thereafter, 200 of ultrapure water was charged, a resultant mixture was stirred, and then an aqueous underlayer was removed. This operation was repeated six times to remove a lithium salt. Thereafter, a solution thus obtained was concentrated and then dropped into 400 g of methanol to precipitate a polymer, and the solid was collected on a Buechner funnel. This polymer was dried under reduced pressure at 60° C. to give 10.3 g of a white polymer represented by the following formula (A-5) (hereinafter, may be also referred to as "polymer (A-5)" or "PtBuOSt-r-PS-ω-NEt2").

With respect to this polymer (A-5): the Mw was 6,000; the Mn was 5,600; and the Mw/Mn was 1.07.

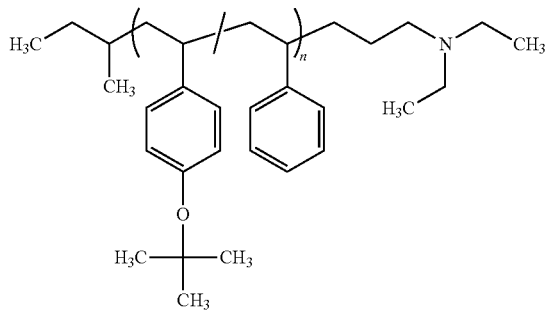
(A-5)

Synthesis Example 6: Synthesis of Polymer (A-6) (PPOEMA-r-PGMA-r-PS-ω-H)

Into a 200 mL three-neck flask, 0.70 g of 2-cyano-2-[(dodecylsulfanylthiocarbonyl)sulfanyl]propane, 0.108 g of azobisisobutyronitrile (hereinafter, may be also referred to as "AIBN"), 3.44 g of 1-propoxyethyl methacrylate, 2.84 g of glycidyl methacrylate, 6.26 g of styrene, and 20 g of propylene glycol monomethyl ether acetate were added, and a resulting mixture was heated under nitrogen at 80° C. for 5 hrs with stirring. Next, 0.108 g of AIBN was added and the mixture was heated under nitrogen at 80° C. for 3 hrs with stirring. A resulting polymerization reaction liquid was charged into 500 g of methanol to permit purification by precipitation. Precipitates thus obtained were dissolved in 20 g of propylene glycol monomethyl ether acetate, and 0.66 g of AIBN, 0.812 g of tert-dodecanethiol, and 5 g of propylene glycol monomethyl ether 5 g were added thereto, and a resulting mixture was heated under nitrogen at 83° C. for 6 hrs with stirring. A resulting polymerization liquid was charged into 500 g of methanol to permit purification by precipitation. A resultant pale yellow solid was dried under reduced pressure to give 5.8 g of a polymer represented by the following formula (A-6) (hereinafter, may be also referred to as "polymer (A-6)" or "PPOEMA-r-PGMA-r-PS-ω-H").

With respect to this polymer (A-6): the Mn was 4,200; the Mw was 5,200; and the Mw/Mn was 1.23.

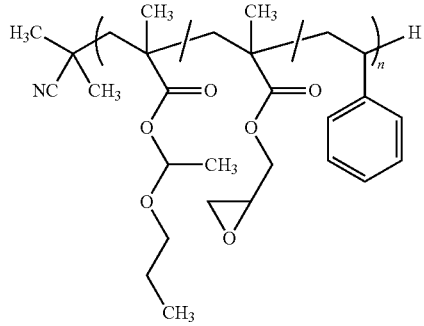
(A-6)

Synthesis Example 7: Synthesis of Polymer (a-1) (PS-ω-PO3Et2)

After a 500 mL flask as a reaction vessel was dried under reduced pressure, 120 g of THF which had been subjected to a distillation dehydrating treatment was charged thereinto in a nitrogen atmosphere, and cooled to −78° C. Thereafter, 2.30 mL of a 1 N cyclohexane solution of sec-BuLi was charged into this THF and then 13.3 mL of styrene which had been subjected to: adsorptive filtration by means of silica gel for removing a polymerization inhibitor; and a dehydration treatment by distillation was added dropwise over 30 min while the internal temperature of the reaction mixture was carefully controlled so as not to be −60° C. or greater, followed by stirring of the mixture for 30 min. Subsequently, 0.33 ml of diethyl chlorophosphate was charged thereinto to allow for a termination reaction of the polymerization end. The temperature of the reaction mixture was elevated to room temperature and the reaction solution thus obtained was concentrated, and replacement with MIBK was conducted. Thereafter, 200 g of a 2% by mass aqueous oxalic acid solution was charged, followed by stirring. After the resulting mixture was left to stand, the aqueous underlayer was removed. This operation was repeated three times to remove a lithium salt. Thereafter, 200 of ultrapure water was charged, a resultant mixture was stirred, and then an aqueous underlayer was removed. After this operation was repeated four times to remove oxalic acid, a solution thus obtained was concentrated and then dropped into 400 g of methanol to precipitate a polymer, and the solid was collected on a Buechner funnel. This polymer was dried under reduced pressure at 60° C. to give 11.5 g of a white polymer represented by the following formula (a-1) (hereinafter, may be also referred to as "polymer (a-1)" or "PS-ω-PO3Et2").

With respect to this polymer (a-1): the Mw was 5,100; the Mn was 4,900; and the Mw/Mn was 1.04.

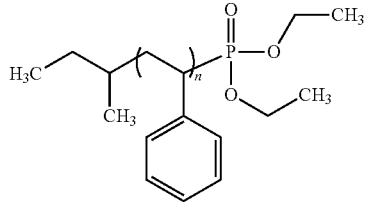
(a-1)

Synthesis Example 8: Synthesis of Polymer (a-2) (PS-ω-PO3H2)

To 10.0 g of the polymer (a-1) obtained in Synthesis Example 7, 0.81 g of triethylamine, 4 g of propylene glycol monomethyl ether, and 40 g of propylene glycol monomethyl ether acetate were added, and a resulting mixture was heated with stirring in a nitrogen atmosphere at 80° C. The temperature of the reaction mixture was elevated to room temperature and the reaction solution thus obtained was concentrated, and replacement with MIBK was conducted. Thereafter, 200 of ultrapure water was charged, a resultant mixture was stirred, and then an aqueous underlayer was removed. After this operation was repeated three times to remove triethylamine, a solution thus obtained was concentrated and then dropped into 400 g of methanol to precipitate a polymer, and the solid was collected on a Buechner funnel. This polymer was dried under reduced pressure at 60° C. to give 9.2 g of a white polymer represented by the following formula (a-2) (hereinafter, may be also referred to as "polymer (a-2)").

With respect to this polymer (a-2): the Mw was 5,100; the Mn was 4,800; and the Mw/Mn was 1.06.

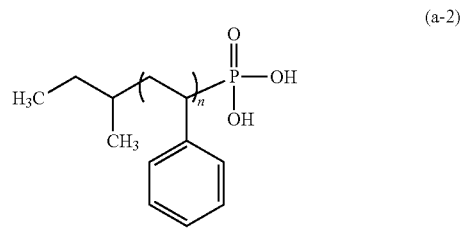

(a-2)

Synthesis Example 9: Synthesis of Polymer (a-3) (PS-ω-CN)

After a 500 mL flask as a reaction vessel was dried under reduced pressure, 120 g of THF which had been subjected to a distillation dehydrating treatment was charged thereinto in a nitrogen atmosphere, and cooled to −78° C. Thereafter, 2.30 mL of a 1 N cyclohexane solution of sec-BuLi was charged into this THF and then 13.3 mL of styrene which had been subjected to: adsorptive filtration by means of silica gel for removing a polymerization inhibitor; and a dehydration treatment by distillation was added dropwise over 30 min while the internal temperature of the reaction mixture was carefully controlled so as not to be −60° C. or greater, followed by stirring of the mixture for 30 min. Subsequently, 0.19 mL of 3-bromopropionitrile was charged to allow for a termination reaction of the polymerization end. The temperature of the reaction mixture was elevated to room temperature and the reaction solution thus obtained was concentrated, and replacement with MIBK was conducted. Thereafter, 200 g of a 2% by mass aqueous oxalic acid solution was charged, followed by stirring. After the resulting mixture was left to stand, the aqueous underlayer was removed. This operation was repeated three times to remove a lithium salt. Thereafter, 200 of ultrapure water was charged, a resultant mixture was stirred, and then an aqueous underlayer was removed. After this operation was repeated three times to remove oxalic acid, a solution thus obtained was concentrated and then dropped into 400 g of methanol to precipitate a polymer, and the solid was collected on a Buechner funnel. This polymer was dried under reduced pressure at 60° C. to give 11.9 g of a white polymer represented by the following formula (a-3) (hereinafter, may be also referred to as "polymer (a-3)" or "PS-ω-CN").

With respect to this polymer (a-3): the Mw was 6,000; the Mn was 5,600; and the Mw/Mn was 1.07.

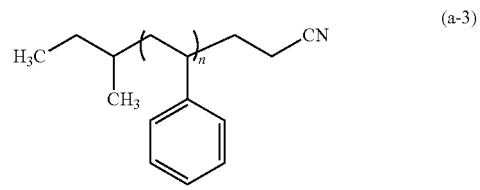

(a-3)

Synthesis Example 10: Synthesis of Polymer (a-4) (PS-ω-SiOH)

After a 500 mL flask as a reaction vessel was dried under reduced pressure, 120 g of THF which had been subjected to a distillation dehydrating treatment was charged thereinto in a nitrogen atmosphere, and cooled to −78° C. Thereafter, 2.30 mL of a 1 N cyclohexane solution of sec-BuLi was charged into this THF and then 13.3 mL of styrene which had been subjected to: adsorptive filtration by means of silica gel for removing a polymerization inhibitor; and a dehydration treatment by distillation was added dropwise over 30 min while the internal temperature of the reaction mixture was carefully controlled so as not to be −60° C. or greater, followed by stirring of the mixture for 30 min. Next, 1.0 g of hexamethylcyclotrisiloxane in a form of a solid was added, and the temperature of the mixture was equilibrated to a normal temperature and then the mixture was stirred. Sixty minutes later, 1 mL of methanol was charged to allow for a termination reaction of the polymerization end. A resulting reaction solution was concentrated, and replacement with MIBK was conducted. Thereafter, 200 g of ultra pure water was charged, followed by stirring. After the resulting mixture was left to stand, the aqueous underlayer was removed. This operation was repeated six times to remove a lithium salt. A solution thus obtained was concentrated and then dropped into 400 g of methanol to precipitate a polymer, and the solid was collected on a Buechner funnel. This polymer was dried under reduced pressure at 60° C. to give 11.3 g of a white polymer represented by the following formula (a-4) (hereinafter, may be also referred to as "polymer (a-4)" or "PS-ω-SiOH").

With respect to this polymer (a-4): the Mw was 5,300; the Mn was 5,100; and the Mw/Mn was 1.04.

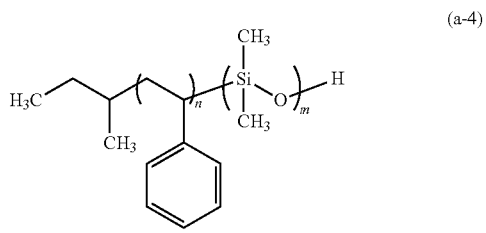

(a-4)

Synthesis Example 11: Synthesis of Polymer (a-5) (PS-ω-NEt2)

After a 500 mL flask as a reaction vessel was dried under reduced pressure, 120 g of THF which had been subjected to a distillation dehydrating treatment was charged thereinto in a nitrogen atmosphere, and cooled to −78° C. Thereafter, 2.30 mL of a 1 N cyclohexane solution of sec-BuLi was charged into this THF and then 13.3 mL of styrene which had been subjected to: adsorptive filtration by means of silica gel for removing a polymerization inhibitor; and a dehydration treatment by distillation was added dropwise over 30 min while the internal temperature of the reaction mixture was carefully controlled so as not to be −60° C. or greater, followed by stirring of the mixture for 90 min. Next, 0.32 ml of chloro-N,N-diethylaminopropane was charged to allow for a termination reaction of the polymerization end. The temperature of the reaction mixture was elevated to room temperature and the reaction solution thus obtained was concentrated, and replacement with MIBK was conducted. Thereafter, 200 of ultrapure water was charged, a resultant mixture was stirred, and then an aqueous underlayer was removed. This operation was repeated six times to remove a lithium salt. Thereafter, a solution thus obtained was concentrated and then dropped into 400 g of methanol to precipitate a polymer, and the solid was collected on a Buechner funnel. This polymer was dried under reduced pressure at 60° C. to give 10.3 g of a white polymer represented by the following formula (a-5) (hereinafter, may be also referred to as "polymer (a-5)" or "PS-ω-NEt2").

With respect to this polymer (a-5): the Mw was 6,000; the Mn was 5,600; and the Mw/Mn was 1.07.

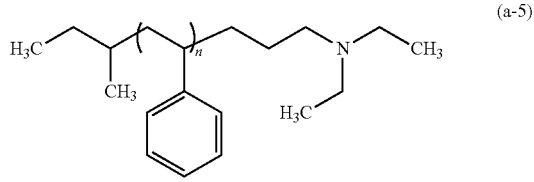

(a-5)

Preparation of Composition

The acid generating agent (B) and the solvent (C) used in preparing each composition are shown below.

(B) Acid Generating Agent

B-1: bis(4-tert-butylphenyl)iodonium nonafluorobutanesulfonic acid (C) Solvent

C-1: propylene glycol monomethyl ether acetate (PGMEA)

C-2: propylene glycol monomethyl ether

C-3: propylene glycol monoethyl ether

Example 1-1: Preparation of Composition (S-1)

A composition (S-1) was prepared by: adding 0.10 g of (B-1) as the acid generating agent (B), and 79.04 g of (C-1) and 19.76 g of (C-2) as the solvent (C) to 1.10 g of (A-1) as the polymer (A); stirring a resulting mixture; and then filtering the mixture through a high-density polyethylene filter having fine pores of 0.45 μm. A solid content concentration of the composition (S-1) was 1.20%. It is to be noted that the "solid content concentration" as referred to herein means a concentration (% by mass) of total components other than the solvent (C) in the composition.

Examples 1-2 to 1-10 and Comparative Examples 1-1 to 1-5: Preparation of Compositions (S-2) to (S-10) and (CS-1) to (CS-5)

Compositions (S-2) to (S-10) and (CS-1) to (CS-5) were prepared in a similar manner to Example 1-1, except that for each component, the type and the amount shown in Table 1 below were used. The solid content concentration of each of the compositions (S-2) to (S-10) and (CS-1) to (CS-5) is also shown in Table 1 below.

TABLE 1

| | | (A) Polymer | | (B) Acid generating agent | | (C) Solvent | | Solid content concentration |
|---|---|---|---|---|---|---|---|---|
| | Composition | Type | amount (g) | type | amount (g) | type | amount (g) | (mass %) |
| Example 1-1 | S-1 | A-1 | 1.10 | B-1 | 0.10 | C-1/C-2 | 79.04/19.76 | 1.20 |
| Example 1-2 | S-2 | A-2 | 1.10 | B-1 | 0.10 | C-1/C-2 | 79.04/19.76 | 1.20 |
| Example 1-3 | S-3 | A-3 | 1.10 | B-1 | 0.10 | C-1/C-2 | 79.04/19.76 | 1.20 |
| Example 1-4 | S-4 | A-4 | 1.10 | B-1 | 0.10 | C-1/C-2 | 79.04/19.76 | 1.20 |
| Example 1-5 | S-5 | A-5 | 1.10 | B-1 | 0.10 | C-1/C-2 | 79.04/19.76 | 1.20 |
| Example 1-6 | S-6 | A-6 | 1.10 | B-1 | 0.10 | C-1/C-2 | 79.04/19.76 | 1.20 |
| Example 1-7 | S-7 | A-2 | 0.98 | B-1 | 0.22 | C-1/C-2 | 79.04/19.76 | 1.20 |
| Example 1-8 | S-8 | A-4 | 0.98 | B-1 | 0.22 | C-1/C-2 | 79.04/19.76 | 1.20 |
| Example 1-9 | S-9 | A-2 | 0.98 | B-1 | 0.22 | C-1/C-3 | 79.04/19.76 | 1.20 |
| Example 1-10 | S-10 | A-4 | 0.98 | B-1 | 0.22 | C-1/C-3 | 79.04/19.76 | 1.20 |
| Comparative Example 1-1 | CS-1 | a-1 | 1.10 | B-1 | 0.10 | C-1/C-2 | 79.04/19.76 | 1.20 |
| Comparative Example 1-2 | CS-2 | a-2 | 1.10 | B-1 | 0.10 | C-1/C-2 | 79.04/19.76 | 1.20 |
| Comparative Example 1-3 | CS-3 | a-3 | 1.10 | B-1 | 0.10 | C-1/C-2 | 79.04/19.76 | 1.20 |
| Comparative Example 1-4 | CS-4 | a-4 | 1.10 | B-1 | 0.10 | C-1/C-2 | 79.04/19.76 | 1.20 |
| Comparative Example 1-5 | CS-5 | a-5 | 1.10 | B-1 | 0.10 | C-1/C-2 | 79.04/19.76 | 1.20 |

Film Formation

In the present Examples, in light of conveniently performing film formation and various types of evaluation described later, not substrates having a surface layer including different regions, but substrates presented below were used as the substrate.

Substrate

W substrate: 8-inch tungsten substrate $SiO_2$ substrate: 8-inch silicon dioxide substrate Co substrate: 8-inch cobalt substrate low-k substrate: 8-inch carbon-doped silicon oxide substrate It is to be noted that the Co substrate and the low-k substrate used were each subjected to a surface treatment (hydrophilization treatment) with a $N_2/(3\%)$ $H_2$ gas mixture (condition: 25° C., 60 sec, 300 mW, 30 Pa, 300 sccm), using a plasma treatment apparatus ("Luminous NA-1300" available from ULVAC, Inc.).

Example 2-1

Various types of substrates shown in Table 2 below were cut into pieces of 3 cm×3 cm, and the composition (S-1) prepared described above was spin-coated under a condition involving 1,500 rpm for 20 sec by using a spin coater ("MS-B300" available from Mikasa Co., Ltd.) to form coating films. Subsequently, the substrates having the coating film thus formed were baked at 150° C. for 180 sec to form films. Thereafter, the substrates were washed with propylene glycol monomethyl ether acetate. This washing removes an unadsorbed film in a case of the film not being adsorbed on the surface of the substrates. It is to be noted that the aforementioned treatment (hereinafter, may be also referred to as "first treatment") corresponds to the first step in the pattern-forming method.

On the substrate after being subjected to the first treatment, a contact angle of the surface was measured by using a contact angle scale ("Drop master DM-501" available from Kyowa Interface Science Co., LTD.), revealing 89.8° for the W substrate, and 47.8° for the $SiO_2$ substrate. Since values of the contact angles of various types of substrates before the first treatment were 62° for the W substrate, and 46.2° for the $SiO_2$ substrate, it is shown that the film was selectively formed on the W substrate, causing a significant change in the contact angle as compared with that before the first treatment.

On various types of the substrates after the first treatment, the composition (S-1) was spin-coated at 1,500 rpm for 20 sec to form coating films by using the spin coater described above. Subsequently, films were formed by baking at 250° C. for 600 sec. Subsequently, the substrates were washed with propylene glycol monomethyl ether acetate. This washing removes an unadsorbed film in a case of the film not being adsorbed on the surface of the substrate. It is to be noted that the aforementioned treatment (hereinafter, may be also referred to as "second treatment") corresponds to the second step in the pattern-forming method.

Examples 2-2 to 2-6 and Comparative Examples 2-1 to 2-3

The first treatment and the second treatment were carried out similarly to Example 2-1 except that each composition shown in Table 2 below was used.

Examples 3-1 to 3-4 and Comparative Examples 3-1 to 3-2

The first treatment and the second treatment were conducted similarly to Example 2-1 except that each composition and each substrate shown in Table 3 below were used.

In Example 3-1, on the substrate after being subjected to the first treatment, a contact angle of the surface was measured by using a contact angle scale ("Drop master DM-501" available from Kyowa Interface Science Co., LTD.), revealing 47.5° on the surface of the Co substrate, and 91.7° for the low-k substrate. Since values of the contact angles of various types of substrates before the first treatment were less than 20° for the Co substrate, and 55° for the low-k substrate, it is shown that the film was selectively formed on the low-k substrate, causing a significant change in the contact angle as compared with that before the first treatment.

Evaluations

Measurement of Average Thickness of Film After First Treatment

An average thickness of the film formed on the substrate after being subjected to the first treatment was measured by using a spectroscopic ellipsometer ("M2000D" available from J. A. WOOLLAM Co.). In a case in which the average thickness of the film is no less than 1 nm, it can be assessed that the film was formed on the substrate. Measurements (unit: nm) of the average thicknesses of the films are shown together in Tables 2 and 3 below.

Measurement of Average Thickness of Film after Second Treatment

An average thickness of the film formed on the substrate after being subjected to the second treatment was measured by using the spectroscopic ellipsometer described above. Measurements (unit: nm) of the average thicknesses of the films are shown together in Tables 2 and 3 below. In a case in which the average thickness of the film after the second treatment increases when compared with the average thickness of the film after the first treatment, it can be assessed that the film increased in thickness.

TABLE 2

| | | W substrate | | $SiO_2$ substrate | |
|---|---|---|---|---|---|
| | composition | average thickness after first treatment | average thickness after second treatment | average thickness after first treatment | average thickness after second treatment |
| Example 2-1 | S-1 | 4.8 | 20.1 | 0.3 | 0.6 |
| Example 2-2 | S-2 | 5 | 19.8 | 0.3 | 0.6 |
| Example 2-3 | S-3 | 4.2 | 19.5 | 0.3 | 0.7 |
| Example 2-4 | S-6 | 3.6 | 17.5 | 0.3 | 0.6 |
| Example 2-5 | S-7 | 5 | 16.2 | 0.3 | 0.7 |
| Example 2-6 | S-9 | 5 | 20.3 | 0.3 | 0.6 |
| Comparative Example 2-1 | CS-1 | 4.7 | 4.7 | 0.3 | 0.3 |
| Comparative Example 2-2 | CS-2 | 4.8 | 4.8 | 0.3 | 0.3 |
| Comparative Example 2-3 | CS-3 | 4.2 | 4.2 | 0.3 | 0.3 |

TABLE 3

|  | Composition | Co substrate average thickness after first treatment | Co substrate average thickness after second treatment | Low-k substrate average thickness after first treatment | Low-k substrate average thickness after second treatment |
|---|---|---|---|---|---|
| Example 3-1 | S-4 | 0.3 | 1.2 | 3.6 | 18.9 |
| Example 3-2 | S-5 | 0.3 | 1.2 | 3.8 | 19.2 |
| Example 3-3 | S-8 | 0.3 | 1.3 | 3.6 | 14.6 |
| Example 3-4 | S-10 | 0.3 | 1.2 | 3.6 | 19.3 |
| Comparative Example 3-1 | CS-4 | 0.3 | 0.3 | 3.6 | 3.6 |
| Comparative Example 3-2 | CS-5 | 0.3 | 0.4 | 3.8 | 3.6 |

From the results shown in Tables 2 and 3, in the cases in which the compositions of the Examples were each used, the film formation and the increase in film thickness were ascertained on the W substrate and the low-k substrate, while the film formation and the increase in film thickness were insufficient on the SiO$_2$ substrate and the Co substrate. On the other hand, in the case in which the compositions of the Comparative Examples were each used, the film formation and the increase in film thickness were insufficient on all of the substrates.

Accordingly, it is evident that by using the compositions of the Examples, the pattern having a height in a regionally selective manner can be formed on the substrate having the surface layer including the first region which includes a metal atom, and the second region which includes a silicon atom.

The pattern-forming method and the composition of the embodiments of the present invention enable a pattern having a height in a regionally selective manner on certain regions of a base to be formed by a convenient method.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
applying a first composition on a surface layer of a substrate to form a first coating film, the surface layer comprising a first region which comprises a metal atom, and a second region which comprises a silicon atom, wherein the first composition comprises a first polymer; and a solvent, the first polymer comprising: a first structural unit which comprises an acid-labile group; and a functional group which selectively bonds to a metal atom or an Si—OH bond;
heating the first coating film;
removing a portion other than a portion formed on the first region or a portion other than a portion formed on the second region of the first coating film heated, thereby forming a first lamination portion in which the first coating film is formed on the substrate;
applying a second composition on the substrate on which the first lamination portion is formed to form a second coating film, wherein the second composition comprises: a second polymer comprising the first structural unit an acid generating agent and a solvent;
heating or exposing the second coating film such that the acid-labile group is dissociated from the first structural unit included in each of the first polymer and the second polymer due to an action of an acid generated from the acid generating agent upon the heating or exposing, and that graft polymerization occurs at dissociated portions of the first polymer and dissociated portions of the second polymer; and
rinsing the second coating film with a rinse agent to remove a portion of the second coating film heated or exposed, which is other than a portion formed on the first lamination portion, thereby forming a second lamination portion in which the second coating film is formed on the first lamination portion.

2. The pattern-forming method according to claim 1, wherein the first polymer comprises the functional group at an end of a main chain thereof.

3. The pattern-forming method according to claim 1, wherein the first polymer and second polymer each comprise the acid-labile group at an end of a side chain thereof.

4. The pattern-forming method according to claim 1, wherein the functional group selectively bonds to the metal atom, and the functional group is a phosphonic acid group, a phosphonic acid ester group, a cyano group, a sulfanyl group, a monohydroxyboryl group, a phenolic hydroxyl group, a pyridine ring-containing group, an ethylenic carbon-carbon double bond-containing group, or a carbon-carbon triple bond-containing group.

5. The pattern-forming method according to claim 4, wherein the functional group is a phosphonic acid group, a phosphonic acid ester group or a cyano group.

6. The pattern-forming method according to claim 1, wherein the functional group selectively bonds to the Si—OH bond, and the functional group is a silanol group or a tertiary amino group.

7. The pattern-forming method according to claim 1, wherein the first composition further comprises an acid generating agent.

8. The pattern-forming method according to claim 1, wherein the second polymer further comprises the functional group.

9. The pattern-forming method according to claim 1, wherein the first structural unit is represented by formula (1-1) or formula (1-2):

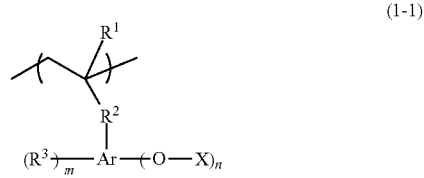

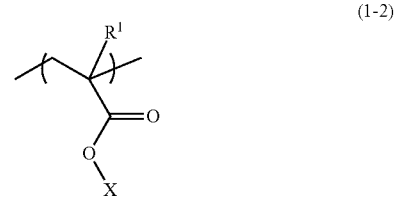

wherein,
in the formula (1-1) and the formula (1-2), R$^1$ represents a hydrogen atom, a fluorine atom, a methyl group, or a trifluoromethyl group; and X represents the acid-labile group; and
in the formula (1-1), R$^2$ represents a single bond, —O—, —COO—, or —CONH—; Ar represents a group obtained by removing from an arene having 6 to 20 ring atoms, (m+n+1) hydrogen atoms on an aromatic ring thereof; m is an integer of 0 to 10, wherein in a case in which m is 1, $R^3$ represents a halogen atom or a monovalent organic group having 1 to 20 carbon atoms, in a case in which m is no less than 2, a plurality of $R^3$s are identical or different from each other and each $R^3$ represents a halogen atom or a monovalent organic group having 1 to 20 carbon atoms, or two or more of the plurality of $R^3$s taken together represent an alicyclic structure having 4 to 20 ring atoms, together with the carbon chain to which the two or more of the plurality of $R^3$s bond; and n is an integer of 2 to 11, wherein a sum of m and n is no greater than 11, and in a case in which n is no less than 2, a plurality of Xs are identical or different from each other.

10. The pattern-forming method according to claim 9, wherein X is represented by formula (2-1), formula (2-2), formula (2-3) or formula (2-4):

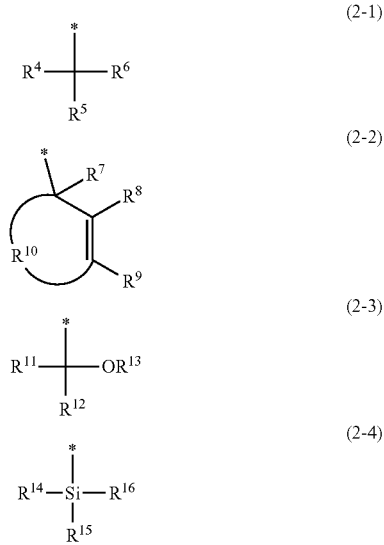

wherein, in the formulae (2-1) to (2-4), * denotes a bonding site to the oxygen atom in the formula (1-1) or the formula (1-2);

in the formula (2-1), $R^4$ represents a monovalent hydrocarbon group having 1 to 20 carbon atoms; $R^5$ and $R^6$ each independently represent a monovalent hydrocarbon group having 1 to 20 carbon atoms, or $R^5$ and $R^6$ taken together represent an alicyclic structure having 3 to 20 ring atoms, together with the carbon atom to which $R^5$ and $R^6$ bond;

in the formula (2-2), $R^7$ represents a hydrogen atom; $R^8$ and $R^9$ each independently represent a hydrogen atom or a monovalent hydrocarbon group having 1 to 20 carbon atoms; and $R^{10}$ represents a divalent hydrocarbon group having 1 to 20 carbon atoms constituting an unsaturated alicyclic structure having 4 to 20 ring atoms, together with the carbon atom to which $R^7$, $R^8$, and $R^9$ each bond;

in the formula (2-3), $R^{11}$ and $R^{12}$ each independently represent a hydrogen atom or a monovalent hydrocarbon group having 1 to 20 carbon atoms, and $R^{13}$ represents a monovalent hydrocarbon group having 1 to 20 carbon atoms, or $R^{11}$ and $R^{12}$ taken together represent an alicyclic structure having 3 to 20 ring atoms, together with the carbon atom to which $R^{11}$ and $R^{12}$ bond, or $R^{12}$ and $R^{13}$ taken together represent an aliphatic heterocyclic structure having 5 to 20 ring atoms, together with the carbon atom to which $R^{12}$ bonds and with the oxygen atom to which $R^{13}$ bonds; and in the formula (2-4), $R^{14}$, $R^{15}$, and $R^{16}$ each independently represent a monovalent hydrocarbon group having 1 to 20 carbon atoms.

11. The pattern-forming method according to claim 1, wherein the metal atom constitutes a metal simple substance, an alloy, an electrically conductive nitride, or a silicide.

12. The pattern-forming method according to claim 1, wherein the silicon atom constitutes a silicon atom simple substance, an oxide, a nitride, a carbon-doped oxide, a carbide, or a silicic acid ester.

13. The pattern-forming method according to claim 1, wherein after the second coating film is rinsed, at least part of the portion of the second coating film which is formed on the first lamination portion remains.

14. The pattern-forming method according to claim 1, further comprising:

applying a third composition on the substrate on which the second lamination portion is formed to form a third coating film, wherein the third composition comprises: a third polymer comprising the first structural unit; an acid generating agent; and a solvent;

heating or exposing the third coating film; and rinsing the third coating film with a rinse agent to remove a portion of the third coating film heated or exposed, which is other than a portion formed on the second lamination portion, thereby forming a third lamination portion in which the third coating film is formed on the second lamination portion.

15. The pattern-forming method according to claim 1, wherein a proportion of the first structural unit in the first polymer with respect to total structural units constituting the first polymer is from 0.1 to 80 mol %.

16. The pattern-forming method according to claim 1, wherein a proportion of the first structural unit in the first polymer with respect to total structural units constituting the first polymer is from 10 to 50 mol %.

17. The pattern-forming method according to claim 1, wherein the acid-labile group is a group that substitutes a hydrogen atom of a phenolic hydroxyl group and that is dissociate by an action of an acid.

* * * * *